(12) United States Patent
Nanao et al.

(10) Patent No.: US 7,264,744 B2
(45) Date of Patent: Sep. 4, 2007

(54) PIEZOELECTRIC CERAMIC AND PIEZOELECTRIC DEVICE

(75) Inventors: Masaru Nanao, Tokyo (JP); Masahito Furukawa, Tokyo (JP); Hideya Sakamoto, Tokyo (JP); Takeo Tsukada, Tokyo (JP)

(73) Assignee: TDK Corporation, Tokyo (JP)

( * ) Notice: Subject to any disclaimer, the term of this patent is extended or adjusted under 35 U.S.C. 154(b) by 362 days.

(21) Appl. No.: 11/082,025

(22) Filed: Mar. 17, 2005

(65) Prior Publication Data

US 2005/0212388 A1 Sep. 29, 2005

(30) Foreign Application Priority Data

| Mar. 26, 2004 | (JP) | ............................. 2004-092822 |
| Apr. 9, 2004 | (JP) | ............................. 2004-115825 |
| Feb. 23, 2005 | (JP) | ............................. 2005-047718 |
| Feb. 23, 2005 | (JP) | ............................. 2005-047719 |

(51) Int. Cl.
*H01L 41/187* (2006.01)

(52) U.S. Cl. ............................. 252/62.9 PZ; 501/134; 310/358

(58) Field of Classification Search ......... 252/62.9 PZ; 501/134; 310/358
See application file for complete search history.

(56) References Cited

U.S. PATENT DOCUMENTS 4,536,821 A 8/1985 Wheeler et al.
6,454,959 B1 * 9/2002 Yoshizawa et al. ... 252/62.9 PZ 2002/0041132 A1 4/2002 Yoshizawa et al.

FOREIGN PATENT DOCUMENTS

| DE | 2 314 152 | 10/1973 |
| DE | 41 27 829 A1 | 3/1993 |
| EP | 1 367 036 A2 | 12/2003 |
| JP | 44-17344 | 7/1969 |
| JP | 45-39977 | 12/1970 |
| JP | A 61-129888 | 6/1986 |
| JP | 03-40965 | * 2/1991 |
| JP | A 3-40965 | 2/1991 |
| JP | A 11-92217 | 4/1999 |
| JP | A 2001-181035 | 7/2001 |
| JP | A 2001-181036 | 7/2001 |

OTHER PUBLICATIONS

Hou et al., "Piezoelectric Properties of New $MnO_2$-added 0.2 PZN-0.8 PZT Ceramic," Materials Letters, vol. 58, pp. 1508-1512, 2004.

* cited by examiner

*Primary Examiner*—C. Melissa Koslow
(74) *Attorney, Agent, or Firm*—Oliff & Berridge, PLC

(57) ABSTRACT

A piezoelectric ceramic and a piezoelectric device capable of being fired at a low temperature and improving piezoelectric properties are provided. The piezoelectric ceramic and the piezoelectric device includes $Pb_a[(Zn_{b/3}Nb_{2/3})_x Ti_y Zr_z]O_3$ (where $0.94 \leq a \leq 1.02$, $1 < b \leq 3$, $x+y+z=1$, $0.05 \leq x < 0.125$, $0.275 < y \leq 0.5$, $0.375 < z \leq 0.6$) or $(Pb_e Me_f)[(Zn_{g/3}Nb_{2/3})_u Ti_v Zr_w]O_3$ (where $0.96 \leq e \leq 1.03$, $0.01 \leq f \leq 0.1$, $1 < g \leq 3$, $u+v+w=1$, $0.05 \leq u < 0.125$, $0.275 < v \leq 0.5$, $0.375 < w \leq 0.6$, and Me indicates Sr, Ba or Ca). When an excessive amount of Zn is included, the firing temperature can be lower, and the piezoelectric properties can be improved.

8 Claims, 7 Drawing Sheets

PIEZOELECTRIC CERAMIC AND PIEZOELECTRIC DEVICE

BACKGROUND OF THE INVENTION

1. Field of the Invention

The present invention relates to a piezoelectric ceramic and a piezoelectric device applicable to, for example, a piezoelectric vibrator such as an actuator, a piezoelectric buzzer, a sound component and a sensor, and specifically suitable for a multilayer piezoelectric vibrator.

2. Description of the Related Art

One of conventional devices using displacement generated by a piezoelectric effect as a mechanical driving source is an actuator. Specifically, compared to an electromagnetic actuator, a multilayer actuator in which a piezoelectric layer and an internal electrode are laminated has lower power consumption, a lower heating value and better responsivity, and the size and the weight of the multilayer actuator can be reduced. Therefore, in recent years, the multilayer actuator is used in various fields such as a needle selection control of a fabric-knitting machine.

Piezoelectric ceramics used for these actuators are required to have large piezoelectric properties, specifically a large piezoelectric constant d. As a piezoelectric ceramic capable of obtaining a large piezoelectric constant d, for example, a ternary system of lead titanate ($PbTiO_3$; PT), lead zirconate ($PbZrO_3$; PZ) and lead zinc niobate ($Pb(Zn_{1/3}Nb_{2/3})O_3$) (for example, refer to Japanese Examined Patent Application Publication No. Sho 44-17344 and Japanese Unexamined Patent Application Publication No. 2001-181035) and the ternary system to which bismuth (Bi) and zinc (Zn) are added (for example, refer to Japanese Unexamined Patent Application Publication No. Hei 3-40965) are known. Further, the ternary system in which strontium (Sr), barium (Ba), calcium (Ca) or the like is substituted for a part of lead (Pb) has been proposed (for example, refer to Japanese Examined Patent Application Publication No. Sho 45-39977 and Japanese Unexamined Patent Application Publication Nos. Sho 61-129888 and 2001-181036).

However, in a conventional piezoelectric ceramic, the firing temperature is as high as approximtely 1200° C., so when a multilayer piezoelectric device is manufactured, it is necessary to use an expensive noble metal such as platinum (Pt) or palladium (Pd) for the internal electrode, which causes a high manufacturing cost. Therefore, in order to use a lower-cost material for the internal electrode, a reduction in the firing temperature is desired.

For example, in the case where a lower-cost silver-palladium (Ag—Pd) alloy is used for the internal electrode, a oxidation-reduction reaction on palladium occurs during firing, which may cause a crack or peeling, so the palladium content is required to be 30 mass % or less, and for that purpose, according to the phase diagram of the silver-palladium system, the firing temperature is required to be 1150° C. or less, preferably 1120° C. or less. Moreover, in order to further reduce the manufacturing cost, it is preferable to further reduce the palladium content. For example, in order to contain the 20 mass % or less of palladium, the firing temperature is required to be 1050° C. or less, and in order to contain 15% or less of palladium, the firing temperature is required to be 1000° C. or less.

Moreover, using a lower-cost copper (Cu) for the internal electrode has been considered recently. However, the melting point of copper is 1085° C., so the firing temperature is required to be 1050° C. or less. In addition, copper is a base metal, so copper is oxidized when copper is fired in an air atmosphere, thereby copper cannot be used as the electrode. Therefore, it is necessary to fire copper in a low oxygen reducing atmosphere.

Moreover, in general, a proportional relationship is established between the piezoelectric constant d, an electromechanical coupling factor kr and a relative dielectric constant ∈r, so in the conventional piezoelectric ceramic, in order to obtain a large piezoelectric constant d, the electromechanical coupling factor kr and the relative dielectric constant ∈r are increased. However, when the relative dielectric constant ∈r increases, the impedance declines, so when the piezoelectric device is driven, a large amount of current flows through the piezoelectric device, thereby an energy required for driving the piezoelectric device is increased.

In addition, recently, the piezoelectric actuator is used in an automobile engine, a hot-melt type ink jet printer or the like, so the operating temperature may reach approximately 150° C. Therefore, a temperature eliminating piezoelectric properties, that is, a so-called Curie temperature is desired to be 300° C. or more.

SUMMARY OF THE INVENTION

In view of the foregoing, it is a first object of the invention to provide a piezoelectric ceramic and a piezoelectric device capable of being fired at a low temperature and improving piezoelectric properties.

It is a second object of the invention to provide a piezoelectric ceramic and a piezoelectric device capable of being fired at a low temperature, improving piezoelectric properties, keeping an energy required for driving low, and obtaining a high Curie temperature.

A first piezoelectric ceramic according to the invention includes a composition represented by Chemical Formula 1.

$Pb_a[(Zn_{b/3}Nb_{2/3})_xTi_yZr_z]O_3$           (Chemical Formula 1)

In Chemical Formula 1, the values of a, b, x, y and z are within a range satisfying $0.94 \leq a \leq 1.02$, $1 < b \leq 3$, $x+y+z=1$, $0.05 \leq x < 0.125$, $0.275 < y \leq 0.5$ and $0.375 < z \leq 0.6$, respectively.

In the first piezoelectric ceramic according to the invention preferably further includes 1.0 mass % or less of at least one kind selected from the group consisting of antimony (Sb), tantalum (Ta), niobium (Nb), tungsten (W), molybdenum (Mo), iron (Fe), cobalt (Co), nickel (Ni) and chromium (Cr) in the form of oxide ($Sb_2O_3$, $Ta_2O_5$, $Nb_2O_5$, $WO_3$, $MoO_3$, $Fe_2O_3$, $Co_3O_4$, NiO, $Cr_2O_3$) in proportion to the composition represented by Chemical Formula 1.

In a first piezoelectric device according to the invention, the first piezoelectric ceramic according to the invention is used.

A second piezoelectric ceramic according to the invention includes a composition represented by Chemical Formula 2.

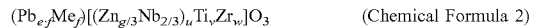

$(Pb_{e-f}Me_f)[(Zn_{g/3}Nb_{2/3})_uTi_vZr_w]O_3$           (Chemical Formula 2)

In Chemical Formula 2, the values of e, f, g, u, v and w are within a range satisfying $0.96 \leq e \leq 1.03$, $0.01 \leq f \leq 0.1$, $1 < g \leq 3$, $u+v+w=1$, $0.05 \leq u < 0.125$, $0.275 < v \leq 0.5$ and $0.375 < w \leq 0.6$, respectively, and Me indicates at least one kind selected from the group consisting of strontium, barium and calcium.

The second piezoelectric ceramic according to the invention preferably further includes 1.0 mass % or less of at least one kind selected from the group consisting of tantalum, antimony, niobium, tungsten, molybdenum, iron, cobalt, nickel and chromium in the form of oxide ($Ta_2O_5$, $Sb_2O_3$, $Nb_2O_5$, $WO_3$, $MoO_3$, $Fe_2O_3$, $Co_3O_4$, $NiO$, $Cr_2O_3$) in proportion to the composition represented by Chemical Formula 2.

In a second piezoelectric device according to the invention, the second piezoelectric ceramic according to the invention is used.

In the first piezoelectric ceramic according to the invention, zinc larger than the stoichiometric composition is included, and the composition x of zinc and niobium is within a range of $0.05 \leq x < 0.125$, so the firing temperature can be lowered to 1050° C. or less, and while the relative dielectric constant ∈r is kept low, the piezoelectric properties can be improved, and a high Curie temperature of 300° C. or more can be obtained. Moreover, even if firing is carried out in a low oxygen reducing atmosphere, high piezoelectric properties could be obtained.

Therefore, in the first piezoelectric device using the first piezoelectric ceramic according to the invention, a silver-palladium alloy, copper or the like which is inexpensive can be used for internal electrodes, thereby the manufacturing cost can be reduced. Moreover, a large amount of displacement can be obtained, and an energy required for driving can be kept low. Further, the first piezoelectric device can be used in a high temperature environment.

In particular, when a predetermined amount of at least one kind selected from the group consisting of antimony, tantalum, niobium, tungsten, molybdenum, iron, cobalt, nickel and chromium is included, the firing temperature can be lower, for example, 1000° C. or less, or the piezoelectric properties can be further improved.

Moreover, in the second piezoelectric ceramic according to the invention, at least one kind selected from the group consisting of strontium, barium and calcium is substituted for a part of lead, and zinc larger than the stoichiometric composition is included, and the composition u of zinc and niobium is within a range of $0.05 \leq u < 0.125$, so the firing temperature can be lowered to 1050° C. or less, and the piezoelectric properties can be further improved. Moreover, even if firing is carried out in a low oxygen reducing atmosphere, high piezoelectric properties can be obtained.

Therefore, in the second piezoelectric device using the second piezoelectric ceramic according to the invention, a silver-palladium alloy, copper or the like which is inexpensive can be used for internal electrodes, thereby the manufacturing cost can be reduced. Moreover, a larger amount of displacement can be obtained.

In particular, when a predetermined amount of at least one kind selected from the group consisting of tantalum, antimony, niobium, tungsten, molybdenum, iron, cobalt, nickel and chromium is included, the firing temperature can be lower, or the piezoelectric properties can be further improved.

Other and further objects, features and advantages of the invention will appear more fully from the following description.

DETAILED DESCRIPTION OF THE PREFERRED EMBODIMENTS

Figure 1:
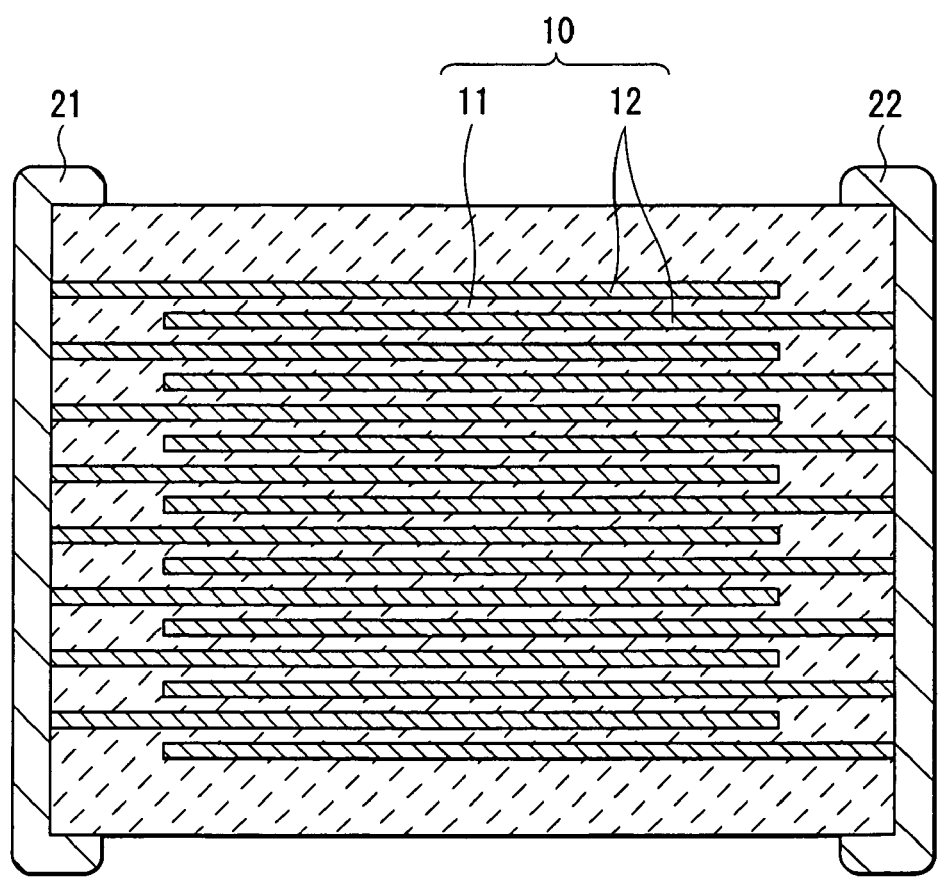
FIG. 1 is a sectional view of an example of a piezoelectric device using a piezoelectric ceramic according to an embodiment of the invention.

Preferred embodiments will be described in detail below referring to the accompanying drawings.

First Embodiment

A piezoelectric ceramic according to a first embodiment of the invention includes a composition represented by Chemical Formula 1 as a main component. Such a composition including lead titanate, lead zirconate and lead zinc niobate can obtain high piezoelectric properties, and a high Curie temperature of 300° C. or more.

$$Pb_a[(Zn_{b/3}Nb_{2/3})_xTi_yZr_z]O_3 \qquad \text{(Chemical Formula 1)}$$

In Chemical Formula 1, the values of a, b, x, y and z are within a range satisfying $0.94 \leq a \leq 1.02$, $1 < b \leq 3$, $x+y+z=1$, $0.05 \leq x < 0.125$, $0.275 < y \leq 0.5$ and $0.375 < z \leq 0.6$, respectively. The composition of oxygen is stoichiometrically determined, and may deviate from the stoichiometric composition.

The composition represented by Chemical Formula 1 has a perovskite structure, and lead is positioned at the so-called A-site of the perovskite structure, and zinc, niobium, titanium (Ti) and zirconium (Zr) are positioned at the so-called B-site of the perovskite structure.

The composition a of lead in Chemical Formula 1 is a composition ratio in the case where an element positioned at the so-called B-site, that is, the composition of $[(Zn_{b/3}Nb_{2/3})_xTi_yZr_z]$ is 1. The value of a is within a range from 0.94 to 1.02, because high piezoelectric properties can be obtained within the range. Further, the value of a is more preferably within a range from greater than 0.94 to less than 1.00, because higher piezoelectric properties can be obtained.

Zinc and niobium ($Zn_{b/3}Nb_{2/3}$) in Chemical Formula 1 are provided to improve the piezoelectric properties. The composition b/3 of zinc is larger than the stoichiometric composition of 1/3, because the firing temperature can be lowered, and the piezoelectric properties can be improved. In particular, the value of b is preferably within a range from 1.05 to 2.0, because the piezoelectric properties can be further improved. Moreover, the composition x of zinc and niobium ($Zn_{b/3}Nb_{2/3}$) is 0.05 or more, because when the composition x is less than 0.05, sufficient piezoelectric properties cannot be obtained, and the composition x is less than 0.125, because when the composition x is 0.125 or more, a large amount of expensive niobium oxide is required, thereby the manufacturing cost is increased, and the relative dielectric constant ∈r and an energy required for driving are increased. In particular, the composition x is preferably within a range from 0.08 to 0.124, because while the relative dielectric constant ∈r is kept low, the piezoelectric properties can be further improved.

The composition y of titanium in Chemical Formula 1 is within a range from greater than 0.275 to 0.5, and the composition z of zirconium is within a range from greater than 0.375 to 0.6, because within the ranges, a structure near a morphotropic phase boundary (MPB) can be obtained, and high piezoelectric properties can be obtained.

The piezoelectric ceramic preferably includes at least one kind selected from the group consisting of antimony, tantalum, niobium, tungsten, molybdenum, iron, cobalt, nickel and chromium as a sub component, because the firing temperature can be further lowered, or the piezoelectric properties can be further improved. Among them, antimony is preferable, because the firing temperature can be further lowered, and without a decline in krx$\sqrt{\in r}$, that is, the piezoelectric properties, the relative dielectric constant $\in r$ can be reduced. Moreover, tantalum is preferable, because the firing temperature can be further lowered, and the piezoelectric properties can be further improved.

The content of the sub-component in the form of oxide ($Sb_2O_3$, $Ta_2O_5$, $Nb_2O_5$, $WO_3$, $MoO_3$, $Fe_2O_3$, $Co_3O_4$, NiO, $Cr_2O_3$) is preferably within a range of 1.0 mass % or less of the composition represented by Chemical Formula 1, because when the content of the sub-component is larger than 1.0 mass %, the sinterability declines, thereby piezoelectric properties declines. Moreover, when the content of the sub-component is too small, a sufficient effect cannot be obtained, so the content of the sub-component is more preferably within a range from 0.01 mass % to 1 mass %. Further, antimony, tantalum, niobium, tungsten, molybdenum, iron, cobalt, nickel and chromium as the sub-component may or may not form a solid solution with the composition of the main component, and when they form a solid solution, for example, they are positioned at the so-called B-site where titanium and zirconium can exist.

The piezoelectric ceramic with such a structure can be manufactured through the following steps, for example.

At fist, as materials of the main component, for example, a lead oxide (PbO) powder, a zinc oxide (ZnO) powder, a niobium oxide ($Nb_2O_5$) powder, a titanium oxide ($TiO_2$) powder and a zirconium oxide ($ZrO_2$) powder are prepared.

Moreover, as a material of the sub-component, if necessary, for example, at least one kind selected from the group consisting of an antimony oxide ($Sb_2O_3$) powder, a tantalum oxide ($Ta_2O_5$) powder, a niobium oxide powder, a tungsten oxide ($WO_3$) powder, a molybdenum oxide ($MoO_3$) powder, an iron oxide ($Fe_2O_3$) powder, a cobalt oxide ($Co_3O_4$) powder, a nickel oxide (NiO) powder and a chromium oxide ($Cr_2O_3$) powder is prepared. As the materials of the main component and the sub-component, instead of oxides, materials which become oxides through firing such as carbonates, oxalates or hydroxides may be used, and instead of carbonates, oxides or any other materials which become oxides through firing may be used.

Next, after the materials are sufficiently dried, the materials are weighed so that the final composition is within the above-described range. The materials of the main component and if necessary, the material of the sub-component are sufficiently mixed in an organic solvent or water by a ball mill or the like, dried, and then pre-fired for 1 hours to 4 hours at 700° C. to 900° C. Next, for example, after the pre-fired body is sufficiently pulverized by the ball mill or the like in an organic solvent or water, and dried, a binder such as polyvinyl alcohol is added to the pre-fired body to granulate the pre-fired body, and then the pre-fired body is press-molded through the use of a uniaxial press molding apparatus, a cold isostatic pressing (CIP) apparatus or the like. After press-molding, for example, the press-molded body is fired in an air atmosphere or a low oxygen reducing atmosphere preferably at 960° C. to 1050° C. for 1 hour to 8 hours. In addition, the firing atmosphere may have a higher oxygen partial pressure than air, or may be a pure oxygen atmosphere. After firing, if necessary, the obtained sintered body is polished, and an electrode for polarization is formed. Then, an electric field is applied to the sintered body in a heated silicone oil to carry out polarization. Then, the electrode for polarization is removed to obtain the above piezoelectric ceramic.

Such a piezoelectric ceramic is preferably used for the material of a piezoelectric device such as an actuator, a piezoelectric buzzer, a sound compound and a sensor, specifically the material of the actuator.

FIG. 1 shows an example of a piezoelectric device using the piezoelectric ceramic according to the embodiment. The piezoelectric device includes a laminate 10 in which a plurality of internal electrodes 12 are sandwiched between a plurality of piezoelectric layers 11 made of, for example, the piezoelectric ceramic according to the embodiment. Each of the piezoelectric layers 11 has a thickness of approximately 1 μm to 100 μm, and the piezoelectric layer 11 at each end of the laminate 10 may have a larger thickness than the piezoelectric layer 11 sandwiched between the internal electrodes 12.

The internal electrodes 12 contain an electrically conductive material. The electrically conductive material is not specifically limited, but for example, silver (Ag), gold (Au), copper, platinum and palladium or an alloy thereof is preferable, and among them, a silver-palladium alloy or copper is specifically preferable. The internal electrodes 12 may contain approximately 0.1 mass % or less of various minor components such as phosphorus (P) in addition to the electrically conductive material.

For example, the internal electrodes 12 are alternately extended in the opposite directions, and a pair of terminal electrodes 21 and 22 electrically connected with the internal electrodes 12 are disposed in the both extending directions. The terminal electrodes 21 and 22 may be formed, for example, through sputtering a metal such as gold, or through firing a paste for the terminal electrodes. The paste for the terminal electrodes includes, for example, an electrically conductive material, a glass frit and a vehicle, and as the electrically conductive material, silver, gold, copper, nickel (Ni), palladium, platinum or an alloy thereof is preferable. The vehicle includes an organic vehicle, a water-based vehicle and the like, and the organic vehicle formed through dissolving a binder in an organic solvent, and the water-based vehicle is formed through dissolving a water-soluble binder, a dispersant and so on in water. The thicknesses of the terminal electrodes 21 and 22 are determined depending upon application or the like if necessary; however, they are typically approximately 10 μm to 50 μm.

The piezoelectric device can be manufactured through the following steps. At first, a pre-fired powder is prepared in the same manner as the above-described method of manufacturing the piezoelectric ceramic, and the vehicle is added to the pre-fired powder, then the pre-fired powder and the vehicle are mixed and kneaded to prepare a paste for the piezoelectric layer. Next, the above-described electrically conductive material for forming the internal electrode 12, or an oxide, an organic metal compound or a resinate which becomes the above-described electrically conductive material after firing is mixed and kneaded with the vehicle to prepare a paste for the internal electrode. In addition, if necessary, an additive such as a dispersant, a plasticizer, a dielectric material and an insulating material may be added to the paste for the internal electrode.

Then, the paste for the piezoelectric layer and the paste for the internal electrode are used to prepare a green chip which is a precursor of the laminate 10 through, for example, a printing method or a sheet method. After that, the binder is removed from the green chip, and the green chip is fired to form the laminate 10. The firing temperature at this time is preferably 960° C. to 1050° C. as described above, and in particular, in the case where a silver-palladium alloy or copper is used as the electrically conductive material of the internal electrodes 12, the firing temperature is preferably as low as 1050° C. or less.

After the laminate 10 is formed, end surfaces of the laminate 10 are polished through, for example, barrel-polishing or sandblasting, and the terminal electrode 21 and 22 are formed through sputtering a metal such as gold, or printing or transferring and firing a paste for the terminal electrode which is prepared as in the case of the paste for the internal electrode. Thereby, the piezoelectric device shown in FIG. 1 can be obtained.

Thus, in the embodiment, the composition of zinc in the composition represented by Chemical Formula 1 is excessive, and the composition x of zinc and niobium is within a range of $0.05 \leq x < 0.125$, so the firing temperature can be lowered to 1050° C. or less, and while the relative dielectric constant ∈r is kept low, the piezoelectric properties can be improved, and a high Curie temperature of 300° C. or more can be obtained. Moreover, even if firing is carried out in a low oxygen reducing atmosphere, high piezoelectric properties can be obtained.

Therefore, a silver-palladium alloy, copper or the like which is inexpensive can be used for the internal electrodes 12, thereby the manufacturing cost can be reduced, and a large amount of displacement can be obtained, and the energy required for driving can be kept low. Moreover, the piezoelectric ceramic can be used in a high temperature environment such as an automobile engine, a hot-melt type ink jet printer.

In particular, when the piezoelectric ceramic includes a predetermined amount of at least one kind selected from the group consisting of antimony, tantalum, niobium, tungsten, molybdenum, iron, cobalt, nickel and chromium, the firing temperature can be lower, for example, 1000° C. or less, or the piezoelectric properties can be further improved.

Second Embodiment

A piezoelectric ceramic according to a second embodiment of the invention includes a composition represented by Chemical Formula 2 as a main component.

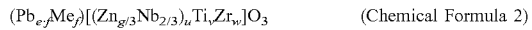

$(Pb_e, Me_f)[(Zn_{g/3}Nb_{2/3})_u Ti_v Zr_w]O_3$      (Chemical Formula 2)

In Chemical Formula 2, the values of e, f, g, u, v and w are within a range satisfying $0.96 \leq e \leq 1.03$, $0.01 \leq f \leq 0.10$, $1 < g \leq 3$, $u+v+w=1$, $0.05 \leq u < 0.125$, $0.275 < v \leq 0.5$ and $0.375 < w \leq 0.6$, respectively, and Me indicates at least one kind selected from the group consisting of strontium, barium and calcium. The composition of oxygen is stoichiometrically determined, and may deviate from the stoichiometric composition.

The composition represented by Chemical Formula 2 has a perovskite structure, and lead, strontium, barium and calcium are positioned at the so-called A-site of the perovskite structure, and zinc, niobium, titanium and zirconium are positioned at the so-called B-site of the perovskite structure. In the composition, at least one kind selected from the group consisting of strontium, barium and calcium is substituted for a part of lead, thereby the piezoelectric properties can be further improved.

The composition e of lead and at least one kind selected from the group consisting of strontium, barium and calcium is a composition ratio of an element positioned at the so-called A-site in the case where the composition of an element positioned at the so-called B-site, that is, $[(Zn_{g/3}Nb_{2/3})_u Ti_v Zr_w]$ is 1. The composition e is within a range from 0.96 to 1.03, because within the range, high piezoelectric properties can be obtained. Further, the composition e is more preferably within a range from 0.96 to 1.01, because higher piezoelectric properties can be obtained.

Moreover, the value of f in Chemical Formula 2, that is, the substitution amount of at least one kind selected from the group consisting of strontium, barium and calcium is preferably within a range from 0.01 to 0.10. When the value of f is less than 0.01, an effect of improving the piezoelectric properties cannot be sufficiently obtained, and when the value of f is larger than 0.10, the sinterability declines, thereby the piezoelectric properties declines.

Zinc and niobium $(Zn_{g/3}Nb_{2/3})$ in Chemical Formula 2 are provided to improve the piezoelectric properties. The composition g/3 of zinc is larger than the stoichiometric composition of 1/3, because the firing temperature can be lowered, and the piezoelectric properties can be improved. In particular, the value of g is preferably within a range from 1.05 to 2.0, because the piezoelectric properties can be further improved. Moreover, the composition u of zinc and niobium $(Zn_{g/3}Nb_{2/3})$ is within a range of 0.05 or more, because when the composition u is less than 0.05, sufficient piezoelectric properties cannot be obtained, and the composition u is less than 0.125, because when the composition u is 0.125 or more, a large amount of expensive niobium oxide is required, thereby the manufacturing cost is increased. In particular, the composition u is preferably within a range from 0.08 to 0.124, because the piezoelectric properties can be further improved.

The composition v of titanium in Chemical Formula 2 is within a range from greater than 0.275 to 0.5, and the composition w of zirconium is within a range from greater than 0.375 to 0.6, because within the ranges, a structure near a morphotropic phase boundary (MPB) can be obtained, and high piezoelectric properties can be obtained.

The piezoelectric ceramic preferably includes at least one kind selected from the group consisting of tantalum, antimony, niobium, tungsten, molybdenum, iron, cobalt, nickel and chromium as a sub-component, because the firing temperature can be lower, or the piezoelectric properties can be further improved. Among them, tantalum is preferable, because a higher effect can be obtained.

The content of the sub-component in the form of oxide ($Ta_2O_5$, $Sb_2O_3$, $Nb_2O_5$, $WO_3$, $MoO_3$, $Fe_2O_3$, $Co_3O_4$, $NiO$, $Cr_2O_3$) is preferably within a range of 1.0 mass % or less of the composition represented by Chemical Formula 2, because when the content of the sub-component is larger than 1.0 mass %, the sinterability declines, thereby the piezoelectric properties declines. Moreover, when the content of the sub-component is too small, a sufficient effect cannot be obtained, so the content of the sub-component is more preferably within a range from 0.01 mass % to 1.0 mass %. Further, tantalum, antimony, niobium, tungsten, molybdenum, iron, cobalt, nickel and chromium as the sub-component may or may not form a solid solution with the composition of the main component, and when they form a solid solution, for example, they are positioned at the so-called B-site where titanium and zirconium can exist.

The piezoelectric ceramic with such a structure can be manufactured through the following steps, for example.

At first, as materials of the main component, for example, a lead oxide (PbO) powder, a zinc oxide (ZnO) powder, a niobium oxide ($Nb_2O_5$) powder, a titanium oxide ($TiO_2$) powder and a zirconium oxide ($ZrO_2$) powder are prepared, and at least one kind selected from the group consisting of a strontium carbonate ($SrCO_3$) powder, a barium carbonate ($BaCO_3$) powder and a calcium carbonate ($CaCO_3$) powder is prepared.

Moreover, as a material of the sub-component, if necessary, for example, at least one kind selected from the group consisting of a tantalum oxide ($Ta_2O_5$) powder, an antimony oxide ($Sb_2O_3$) powder, a niobium oxide powder, a tungsten oxide ($WO_3$) powder, a molybdenum oxide ($MoO_3$) powder, an iron oxide ($Fe_2O_3$) powder, a cobalt oxide ($Co_3O_4$) powder, a nickel oxide (NiO) powder, and a chromium oxide ($Cr_2O_3$) powder is prepared. As the materials of the main component and the sub-component, instead of oxides, materials which become oxides through firing such as carbonates, oxalates or hydroxides may be used, and instead of carbonates, oxides or any other materials which become oxides through firing may be used.

Next, after the materials are sufficiently dried, the materials are weighed so that the final composition is within the above-described range. The materials of the main component and if necessary, the material of the sub-component are sufficiently mixed in an organic solvent or water by a ball mill or the like, dried, and then pre-fired for 1 hours to 4 hours at 700° C. to 900° C. Next, for example, after the pre-fired body is sufficiently pulverized by the ball mill or the like in an organic solvent or water, and dried, a binder such as polyvinyl alcohol is added to the pre-fired body to granulate the pre-fired body, and then the pre-fired body is press-molded through the use of a uniaxial press molding apparatus, a cold isostatic pressing (CIP) apparatus or the like. After press-molding, for example, the press-molded body is fired in an air atmosphere or a low oxygen reducing atmosphere preferably at 1000° C. to 1050° C. for 1 hour to 8 hours. In addition, the firing atmosphere may have a higher oxygen partial pressure than air, or may be a pure oxygen atmosphere. After firing, if necessary, the obtained sintered body is polished, and an electrode for polarization is formed. Then, an electric field is applied to the sintered body in a heated silicone oil to carry out polarization. Then, the electrode for polarization is removed to obtain the above piezoelectric ceramic.

Such a piezoelectric ceramic is preferably used for the material of a piezoelectric device such as an actuator, a piezoelectric buzzer, a sound compound and a sensor, specifically the material of the actuator as in the case of the first embodiment. A specific example of the piezoelectric device is as described in the first embodiment.

Thus, in the embodiment, at least one kind selected from the group consisting of strontium, barium and calcium is substituted for a part of lead, and zinc larger than the stoichiometric composition is included, and the composition u of zinc and niobium is within a range of $0.05 \leq u < 0.125$, so the firing temperature can be lowered to 1050° C. or less, and the piezoelectric properties can be further improved. Moreover, even if firing is carried out in a low oxygen reducing atmosphere, high piezoelectric properties can be obtained. Therefore, a silver-palladium alloy, copper or the like which is inexpensive can be used for the internal electrodes 12, thereby the manufacturing cost can be reduced, and a large amount of displacement can be obtained.

In particular, when the piezoelectric ceramic includes a predetermined amount of at least one kind selected from the group consisting of tantalum, antimony, niobium, tungsten, molybdenum, iron, cobalt, nickel and chromium, the firing temperature can be lower, or the piezoelectric properties can be further improved.

EXAMPLES

Next, specific examples of the invention will be described below.

Examples 1-1 through 1-5

Piezoelectric ceramics including a composition represented by Chemical Formula 3 as a main component were formed. At first, as materials of the main component, a lead oxide powder, a titanium oxide powder, a zirconium oxide powder, a zinc oxide powder and a niobium oxide powder were prepared and weighed so as to have the composition represented by Chemical formula 3. At that time, the value of b in Chemical Formula 3, that is, the composition b/3 of zinc was changed as shown in Table 1 in Examples 1-1 through 1-5.

Next, after the materials were wet-mixed by a ball mill for 16 hours, they were pre-fired in air at 700° C. to 900° C. for 2 hours. Next, the pre-fired body was wet-pulverized by the ball mill for 16 hours and dried. After that, polyvinyl alcohol as a binder was added to the pre-fired body to granulate the pre-fired body, and then the granulated body was molded into a disk shape with a diameter of 17 mm and a thickness of 1 mm through applying a pressure of approximately 245 MPa through the use of a uniaxial press molding apparatus. After molding, the molded body was heated to volatilize the binder, then the molded body was fired in air at 1020° C. for 2 hours to 8 hours. After that, the obtained sintered body was sliced and lapped to form into a disk shape with a thickness of 0.6 mm, and a silver paste was printed on both sides of the sintered body and was fired at 650° C. Then, an electric field of 3 kV/mm was applied to the sintered body in a silicone oil of 120° C. for 15 minutes to carry out polarization. Thereby, the piezoelectric ceramics of Examples 1-1 and 1-5 were obtained.

Figure 2:
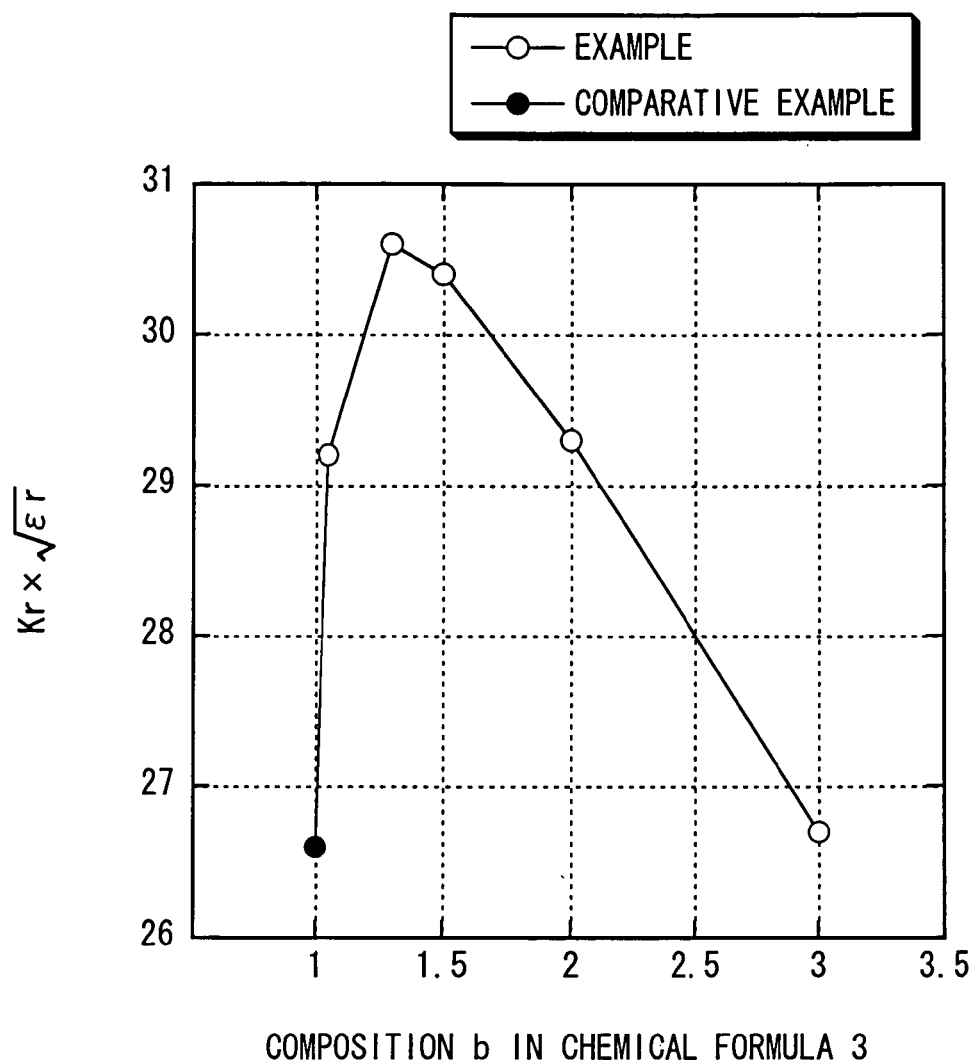
FIG. 2 is a plot showing a relationship between a composition b in Chemical Formula 3 and $krx\sqrt{\in r}$.

After the obtained piezoelectric ceramics of Examples 1-1 through 1-5 were left for 24 hours, the electromechanical coupling factor kr for radial vibration and the relative dielectric constant ∈r of the piezoelectric ceramics of Examples 1-1 through 1-5 were measured. They were measured by an impedance analyzer (Hewlett-Packard's HP4194A), and a frequency when measuring the relative dielectric constant ∈r was 1 kHz. The obtained results are shown in Table 1 and FIG. 2. Moreover, when the Curie temperatures of the piezoelectric ceramics of Examples 1-1 through 1-5 were measured, they were within a range from 310° C. to 340° C.

$$Pb_{0.98}[(Zn_{b/3}Nb_{2/3})_{0.1}Ti_{0.44}Zr_{0.46}]O_3 \qquad \text{(Chemical Formula 3)}$$

TABLE 1

|  | COMPOSITION OF CHEMICAL FORMULA 3 b | FIRING TEMPERATURE (° C.) | ELECTROMECHANICAL COUPLING FACTOR kr (%) | RELATIVE DIELECTRIC CONSTANT $\epsilon r$ | $kr \times \sqrt{\epsilon r}$ |
|---|---|---|---|---|---|
| EXAMPLE 1-1 | 1.05 | 1020 | 68.3 | 1833 | 29.2 |
| EXAMPLE 1-2 | 1.3 | 1020 | 70.2 | 1896 | 30.6 |
| EXAMPLE 1-3 | 1.5 | 1020 | 70.1 | 1878 | 30.4 |
| EXAMPLE 1-4 | 2.0 | 1020 | 68.9 | 1811 | 29.3 |
| EXAMPLE 1-5 | 3.0 | 1020 | 64.5 | 1709 | 26.7 |
| COMPARATIVE EXAMPLE 1-1 | 1.0 | 1100 | 65.1 | 1664 | 26.6 |

As Comparative Example 1-1 relative to the examples, a piezoelectric ceramic was formed as in the case of Examples 1-1 through 1-5, except that the value of b in Chemical Formula 3 was 1, and the firing temperature was 1100° C. at which the highest properties could be obtained. The electromechanical coupling factor kr for radial vibration and the relative dielectric constant ∈r of the piezoelectric ceramic of Comparative Example 1-1 were measured as in the case of Examples 1-1 through 1-5. The results are also shown in Table 1 and FIG. 2.

As shown in Table 1, in Examples 1-1 through 1-5, firing could be carried out at a low temperature of 1020° C.; however, in Comparative Example 1-1, the firing temperature could be lowered to only 1100° C. Moreover, as shown in Table 1 and FIG. 2, in Examples 1-1 through 1-5, $kr\sqrt{\epsilon r}$ could be increased, compared to Comparative Example 1-1. Further, there was a tendency that as the value of b increased, $kr\sqrt{\epsilon r}$ increased to the maximum value, then decreased.

In other words, it was found out that when the value of b was within a range from greater than 1 to 3, the firing temperature could be lowered to 1050° C. or less, and the piezoelectric properties could be improved. Moreover, it was found out that the value of b was more preferably within a range from 1.05 to 2.0.

Examples 2-1 through 2-4

As in the case of Examples 1-1 through 1-5, piezoelectric ceramics including a composition represented by Chemical Formula 4 as a main component were formed. At that time, the values of a, b, y and z in Chemical Formula 4 were changed as shown in Tables 2 through 5 in Examples 2-1 through 2-4. In Examples 2-1 through 2-4, the composition x of zinc and niobium was fixed to 0.1, and the composition a of lead was changed, and the values of b, y and z were compositions where $kr\sqrt{\epsilon r}$ was the largest.

Moreover, as Comparative Examples 2-1 through 2-4 relative to Examples 2-1 through 2-4, piezoelectric ceramics were formed as in the case of Examples 2-1 through 2-4, except that the value of b in Chemical Formula 4 was 1, and the firing temperature was 1060° C. or 1100° C. at which the highest properties could be obtained. Comparative Examples 2-1, 2-2, 2-3 and 2-4 correspond to Examples 2-1, 2-2, 2-3 and 2-4, respectively.

The electromechanical coupling factor kr for radial vibration and the relative dielectric constant ∈r of the piezoelectric ceramics of Examples 2-1 through 2-4 and Comparative Examples 2-1 through 2-4 were measured as in the case of Examples 1-1 through 1-5. The results are shown in Tables 2 through 5. Moreover, when the Curie temperatures of the piezoelectric ceramics of Examples 2-1 through 2-4 were measured, they were within a range of 310° C. to 340° C.

$$Pb_a[(Zn_{b/3}Nb_{2/3})_{0.1}Ti_yZr_z]O_3 \quad \text{(Chemical Formula 4)}$$

TABLE 2

| | COMPOSITION OF CHEMICAL FORMULA 4 | | | | FIRING TEMPERATURE (° C.) | ELECTROMECHANICAL COUPLING FACTOR kr (%) | RELATIVE DIELECTRIC CONSTANT $\epsilon r$ | $kr \times \sqrt{\epsilon r}$ |
|---|---|---|---|---|---|---|---|---|
| | a | b | y | z | | | | |
| EXAMPLE 2-1 | 0.94 | 1.5 | 0.43 | 0.47 | 1020 | 62.7 | 1738 | 26.1 |
| COMPARATIVE EXAMPLE 2-1 | 0.94 | 1.0 | 0.43 | 0.47 | 1060 | 58.4 | 1505 | 22.7 |

TABLE 3

| | COMPOSITION OF CHEMICAL FORMULA 4 | | | | FIRING TEMPERATURE (° C.) | ELECTROMECHANICAL COUPLING FACTOR kr (%) | RELATIVE DIELECTRIC CONSTANT $\epsilon r$ | $kr \times \sqrt{\epsilon r}$ |
|---|---|---|---|---|---|---|---|---|
| | a | b | y | z | | | | |
| EXAMPLE 2-2 | 0.96 | 1.5 | 0.43 | 0.47 | 1020 | 66.0 | 1783 | 27.9 |
| COMPARATIVE EXAMPLE 2-2 | 0.96 | 1.0 | 0.43 | 0.47 | 1060 | 62.1 | 1555 | 24.5 |

TABLE 4

| | COMPOSITION OF CHEMICAL FORMULA 4 | | | | FIRING TEMPERATURE | ELECTROMECHANICAL COUPLING FACTOR | RELATIVE DIELECTRIC CONSTANT | |
|---|---|---|---|---|---|---|---|---|
| | a | b | y | z | (° C.) | kr (%) | $\epsilon r$ | $kr \times \sqrt{\epsilon r}$ |
| EXAMPLE 2-3 | 1.0 | 1.3 | 0.44 | 0.46 | 1020 | 63.4 | 1879 | 27.5 |
| COMPARATIVE EXAMPLE 2-3 | 1.0 | 1.0 | 0.44 | 0.46 | 1100 | 60.4 | 1558 | 23.8 |

TABLE 5

| | COMPOSITION OF CHEMICAL FORMULA 4 | | | | FIRING TEMPERATURE | ELECTROMECHANICAL COUPLING FACTOR | RELATIVE DIELECTRIC CONSTANT | |
|---|---|---|---|---|---|---|---|---|
| | a | b | y | z | (° C.) | kr (%) | $\epsilon r$ | $kr \times \sqrt{\epsilon r}$ |
| EXAMPLE 2-4 | 1.02 | 1.3 | 0.44 | 0.46 | 1020 | 58.9 | 1734 | 24.5 |
| COMPARATIVE EXAMPLE 2-4 | 1.02 | 1.0 | 0.44 | 0.46 | 1100 | 55.6 | 1496 | 21.5 |

As shown in Tables 2 through 5, in Examples 2-1 through 2-4, the firing temperature could be lowered to 1020° C. as in the case of Examples 1-1 through 1-5, and compared to Comparative Examples 2-1 through 2-4, $kr \times \sqrt{\epsilon r}$ could be increased.

Figure 3:
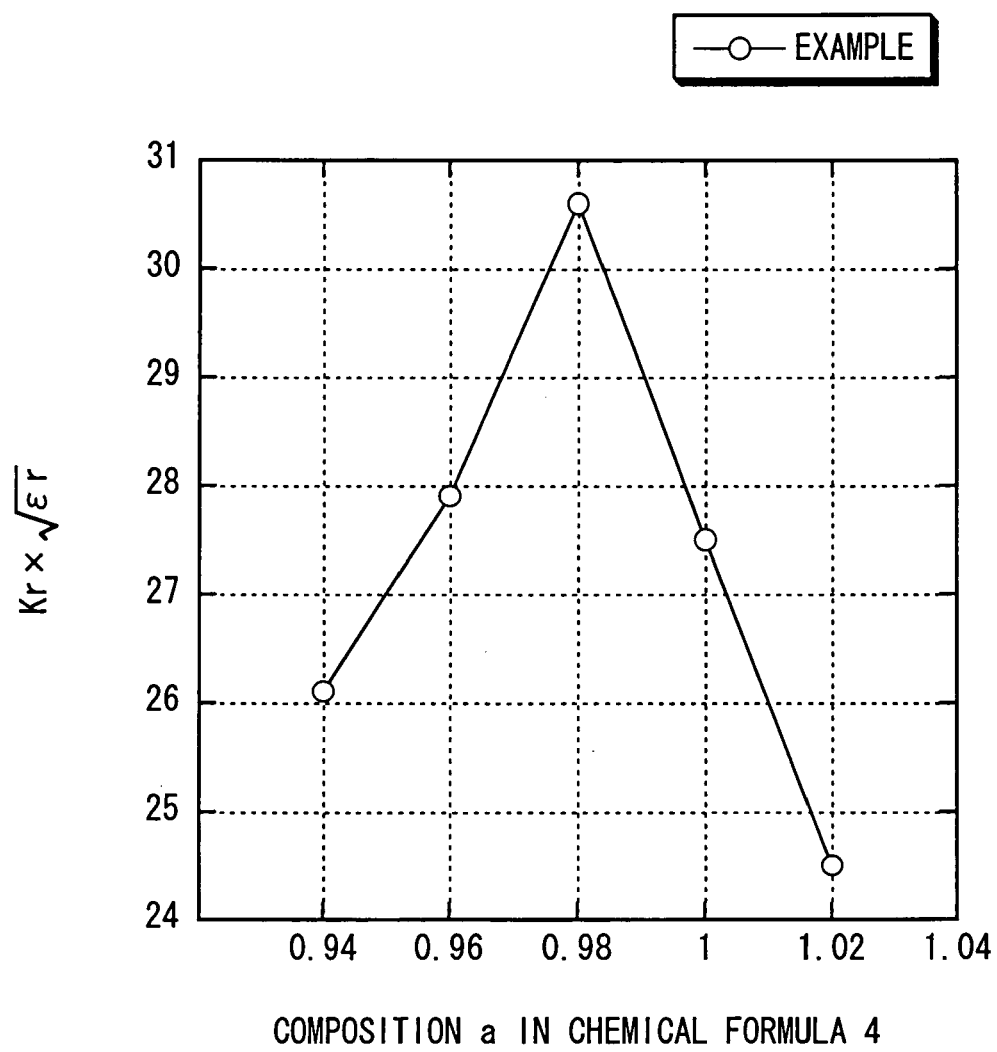
FIG. 3 is a plot showing a relationship between a composition a in Chemical Formula 4 and $krx\sqrt{\in r}$.

Moreover, a relationship between the composition a in Chemical Formula 4, that is, the composition of lead and $kr \times \sqrt{\epsilon r}$ in Examples 2-1 through 2-4 and 1-2 is shown in FIG. 3. As shown in FIG. 3, there was a tendency that as the value of a increased, $kr \times \sqrt{\epsilon r}$ increased to the maximum value, then decreased. In other words, it was found out that when the value of a was within a range from 0.94 to 1.02, the piezoelectric properties could be further improved. Further, it was found out that the value of a was more preferably within a range from greater than 0.94 to less than 1.0.

Examples 3-1 through 3-4

As in the case of Examples 1-1 through 1-5, piezoelectric ceramics including a composition represented by Chemical Formula 5 as a main component were formed. At that time, in Examples 3-1 through 3-4, the values of b, x, y and z in Chemical Formula 5 were changed as shown in Tables 6 through 9. In Examples 3-1 through 3-4, the composition a of lead was fixed to 0.98, and the composition x of zinc and niobium was changed, and the value of b, y and z were compositions where $kr \times \sqrt{\epsilon r}$ was the largest.

Moreover, as Comparative Examples 3-1 through 3-4 relative to Examples 3-1 through 3-4, piezoelectric ceramics were formed as in the case of Examples 3-1 through 3-4, except that the value of b in Chemical Formula 5 was 1, and the firing temperature was 1100° C. at which the highest properties could be obtained. Comparative Examples 3-1, 3-2, 3-3 and 3-4 correspond to Examples 3-1, 3-2, 3-3 and 3-4, respectively.

The electromechanical coupling factor kr for radial vibration and the relative dielectric constant $\epsilon r$ of the piezoelectric ceramics of Examples 3-1 through 3-4 and Comparative Examples 3-1 through 3-4 were measured as in the case of Examples 1-1 through 1-5. The results are shown in Tables 6 through 9. Moreover, when the Curie temperatures of the piezoelectric ceramics of Examples 3-1 through 3-4 were measured, they were within a range of 310° C. to 340° C.

$$Pb_{0.98}[(Zn_{b/3}Nb_{2/3})_x Ti_y Zr_z]O_3 \quad \text{(Chemical Formula 5)}$$

TABLE 6

| | COMPOSITION OF CHEMICAL FORMULA 5 | | | | FIRING TEMPERATURE | ELECTROMECHANICAL COUPLING FACTOR | RELATIVE DIELECTRIC CONSTANT | |
|---|---|---|---|---|---|---|---|---|
| | b | x | y | z | (° C.) | kr (%) | $\epsilon r$ | $kr \times \sqrt{\epsilon r}$ |
| EXMPALE 3-1 | 1.3 | 0.05 | 0.45 | 0.50 | 1020 | 63.2 | 1745 | 26.4 |
| COMPARATIVE EXAMPLE 3-1 | 1.0 | 0.05 | 0.45 | 0.50 | 1100 | 58.6 | 1555 | 23.1 |

TABLE 7

| | COMPOSITION OF CHEMICAL FORMULA 5 | | | | FIRING TEMPERATURE | ELECTROMECHANICAL COUPLING FACTOR | RELATIVE DIELECTRIC CONSTANT | |
|---|---|---|---|---|---|---|---|---|
| | b | x | y | z | (° C.) | kr (%) | $\epsilon r$ | $kr \times \sqrt{\epsilon r}$ |
| EXAMPLE 3-2 | 1.3 | 0.08 | 0.44 | 0.48 | 1020 | 65.2 | 1818 | 27.8 |
| COMPARATIVE EXAMPLE 3-2 | 1.0 | 0.08 | 0.44 | 0.48 | 1100 | 59.8 | 1615 | 24.0 |

TABLE 8

| | COMPOSITION OF CHEMICAL FORMULA 5 | | | | FIRING TEMPERATURE | ELECTROMECHANICAL COUPLING FACTOR | RELATIVE DIELECTRIC CONSTANT | |
|---|---|---|---|---|---|---|---|---|
| | b | x | y | z | (° C.) | kr (%) | $\epsilon r$ | $kr \times \sqrt{\epsilon r}$ |
| EXAMPLE 3-3 | 1.5 | 0.12 | 0.42 | 0.46 | 1020 | 64.3 | 1998 | 28.7 |
| COMPARATIVE EXAMPLE 3-3 | 1.0 | 0.12 | 0.42 | 0.46 | 1100 | 60.7 | 1878 | 26.3 |

TABLE 9

| | COMPOSITION OF CHEMICAL FORMULA 5 | | | | FIRING TEMPERATURE | ELECTROMECHANICAL COUPLING FACTOR | RELATIVE DIELECTRIC CONSTANT | |
|---|---|---|---|---|---|---|---|---|
| | b | x | y | z | (° C.) | kr (%) | $\epsilon r$ | $kr \times \sqrt{\epsilon r}$ |
| EXAMPLE 3-4 | 1.5 | 0.124 | 0.42 | 0.456 | 1020 | 63.9 | 2000 | 28.6 |
| COMPARATIVE EXAMPLE 3-4 | 1.0 | 0.124 | 0.42 | 0.456 | 1100 | 60.2 | 1881 | 26.1 |

As shown in Tables 6 through 9, in Examples 3-1 through 3-4, the firing temperature could be lowered to 1020° C. as in the case of Examples 1-1 through 1-5, and compared to Comparative Examples 3-1 through 3-4, $kr \times \sqrt{\epsilon r}$ could be increased.

Figure 4:
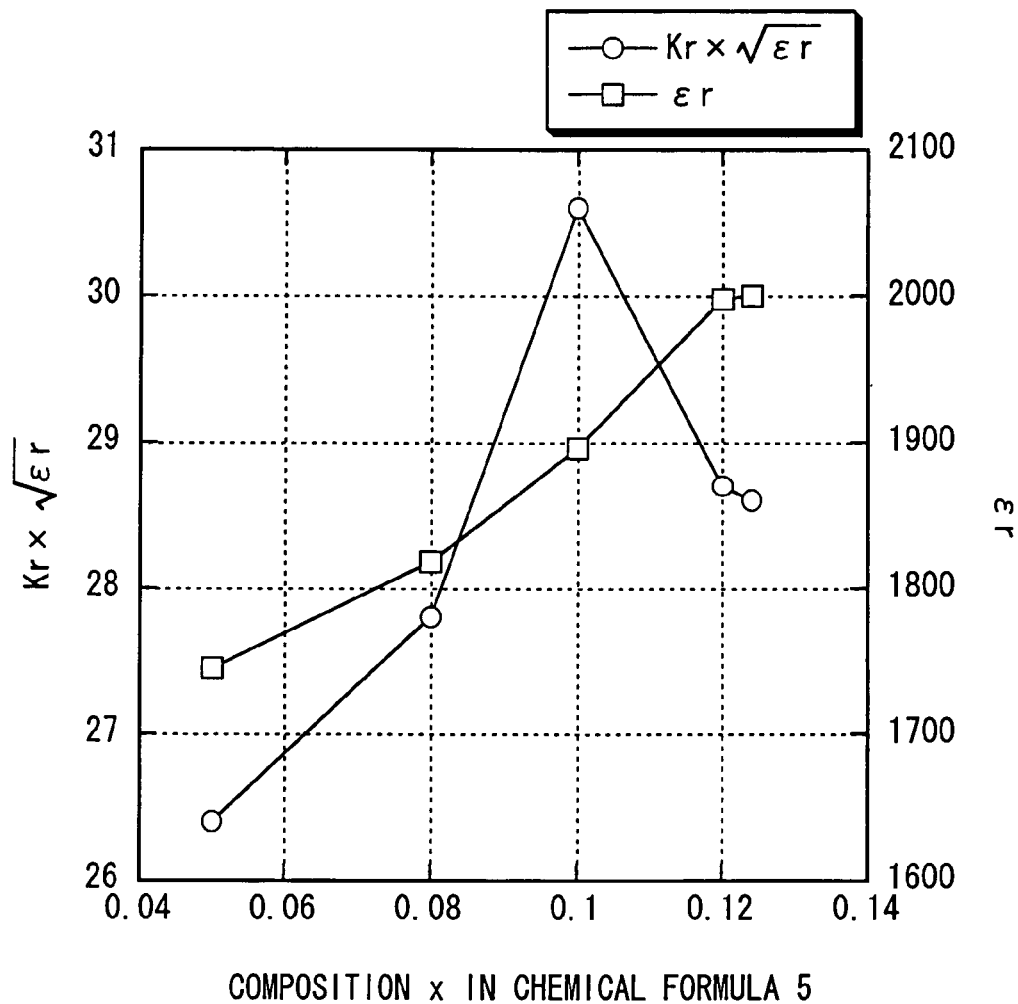
FIG. 4 is a plot showing a relationship between a composition x in Chemical Formula 5, $krx\sqrt{\in r}$ and a relative dielectric constant ∈r.

Moreover, a relationship between the composition x in Chemical Formula 5, that is, the composition of zinc and niobium and $kr \times \sqrt{\epsilon r}$ and the relative dielectric constant $\epsilon r$ in Examples 3-1 through 3-4 and 1-2 is shown in FIG. 4. As shown in FIG. 4, there was a tendency that as the value of x increased, $kr \times \sqrt{\epsilon r}$ increased to the maximum value, then decreased. Moreover, there was a tendency that as the value of x increased, the relative dielectric constant $\epsilon r$ increased. In other words, it was found out that when the value of x was within a range from 0.05 to less than 0.125, while the relative dielectric constant $\epsilon r$ was kept low, the piezoelectric properties could be improved. Moreover, it was found out that the value of x was preferably within a range from 0.08 to 0.124.

Examples 4-1 through 4-12

As in the case of Examples 1-1 through 1-5, piezoelectric ceramics including a composition represented by Chemical Formula 6 as a main component and one kind selected from the group consisting of antimony, tantalum, niobium, tungsten, molybdenum, iron, cobalt, nickel and chromium as a sub-component were formed. As the sub-component, antimony in Examples 4-1 through 4-4, tantalum in Example 4-5, niobium in Example 4-6, tungsten in Example 4-7, molybdenum in Example 4-8, iron in Example 4-9, cobalt in Example 4-10, nickel in Example 4-11, and chromium in Example 4-12 were included, and as their materials, an antimony oxide powder, a tantalum oxide powder, a niobium oxide powder, a tungsten oxide powder, a molybdenum oxide powder, an iron oxide powder, a cobalt oxide powder, a nickel oxide powder, and a chromium oxide powder were used. The content of the sub-component in the form of oxide ($Sb_2O_3$, $Ta_2O_5$, $Nb_2O_5$, $WO_3$, $MoO_3$, $Fe_2O_3$, $Co_3O_4$, $NiO$, $Cr_2O_3$) in proportion to the main component was changed as shown in Table 10 in Examples 4-1 through 4-12. Moreover, the firing temperature was changed as shown in Table 10 so that the highest properties could be obtained.

The electromechanical coupling factor kr for radial vibration and the relative dielectric constant $\epsilon r$ of the piezoelectric ceramics of Examples 4-1 through 4-12 were measured as in the case of Examples 1-1 through 1-5. The results are shown in Table 10 together with the result of Example 1-2 in which no sub-component was added. Moreover, when the Curie temperatures of the piezoelectric ceramics of Examples 4-1 through 4-12 were measured, they were within a range of 310° C. to 340° C.

$Pb_{0.98}[(Zn_{1.3/3}Nb_{2/3})_{0.1}Ti_{0.44}Zr_{0.46}]O_3$ (Chemical Formula 6)

TABLE 10

| | SUB-COMPONENT | | FIRING TEMPERATURE (° C.) | ELECTROMECHANICAL COUPLING FACTOR kr (%) | RELATIVE DIELECTRIC CONSTANT $\epsilon r$ | $kr \times \sqrt{\epsilon r}$ |
|---|---|---|---|---|---|---|
| | KIND | CONTENT (mass %) | | | | |
| EXAMPLE 1-2 | — | — | 1020 | 70.2 | 1896 | 30.6 |
| EXAMPLE 4-1 | Sb | 0.01 | 980 | 70.2 | 1894 | 30.6 |
| EXAMPLE 4-2 | Sb | 0.05 | 960 | 70.2 | 1891 | 30.5 |
| EXAMPLE 4-3 | Sb | 0.4 | 960 | 70.9 | 1880 | 30.7 |
| EXAMPLE 4-4 | Sb | 1.0 | 980 | 70.0 | 1870 | 30.3 |
| EXAMPLE 4-5 | Ta | 0.4 | 960 | 71.3 | 1945 | 31.4 |
| EXAMPLE 4-6 | Nb | 0.4 | 960 | 70.4 | 1906 | 30.7 |
| EXAMPLE 4-7 | W | 0.6 | 1020 | 71.0 | 1919 | 31.1 |
| EXAMPLE 4-8 | Mo | 0.1 | 960 | 70.3 | 1899 | 30.6 |
| EXAMPLE 4-9 | Fe | 0.1 | 960 | 70.2 | 1897 | 30.6 |
| EXAMPLE 4-10 | Co | 0.2 | 960 | 70.4 | 1900 | 30.7 |
| EXAMPLE 4-11 | Ni | 0.3 | 960 | 70.7 | 1915 | 30.9 |
| EXAMPLE 4-12 | Cr | 0.2 | 960 | 70.3 | 1899 | 30.6 |

As shown in Table 10, in Examples 4-1 through 4-6 and 4-8 through 4-12 in which as the sub-component, antimony, tantalum, niobium, molybdenum, iron, cobalt, nickel or chromium was added, compared to Example 1-2 in which no sub-component was added, the firing temperature could be further lowered to 1000° C. or less. Moreover, in Examples 4-3, 4-4 through 4-7, 4-10 and 4-11 in which as the sub-component, antimony, tantalum, niobium, tungsten, cobalt or nickel was added, compared to Example 1-2 in which no sub-component was added, $kr \times \sqrt{\epsilon r}$ could be further increased, and in particular, when tantalum or tungsten was added, a large effect could be obtained. Further, in Examples 4-1 through 4-4 in which as the sub-component, antimony was added, $kr \sqrt{\epsilon r}$ was the same value as that in Example 1-2 in which no sub-component was added, and the relative dielectric constant $\epsilon r$ could be reduced.

In other words, it was found out that when antimony, tantalum, niobium, tungsten, molybdenum, iron, cobalt, nickel or chromium was added as the sub-component, depending upon the sub-component, the firing temperature could be lower, or the piezoelectric properties could be further improved. Moreover, it was found out that antimony, tantalum, niobium, molybdenum, iron, cobalt, nickel or chromium among them was effective to lower the firing temperature, and tantalum or tungsten was effective to improve the piezoelectric properties, and antimony was effective to reduce the relative dielectric constant $\epsilon r$ without a decline in the piezoelectric properties.

Examples 5-1 through 5-4

Piezoelectric ceramics including a composition represented by Chemical Formula 7 as a main component were formed as in the case of Examples 1-1 through 1-5, except that firing was carried out in a low oxygen reducing atmosphere of $1 \times 10^{-3}$ Pa or more in which the oxygen partial pressure was lower than air. At that time, the values of a and b in Chemical Formula 7 were changed as shown in Table 11 in Examples 5-1 through 5-4. Moreover, in Example 5-4, 0.4 mass % of antimony in the form of oxide ($Sb_2O_3$) in proportion to the main component was added. The firing temperature was 1020° C. in Examples 5-1 through 5-3, and 980° C. in Example 5-4.

The electromechanical coupling factor kr for radial vibration and the relative dielectric constant $\epsilon r$ of the piezoelectric ceramics of Examples 5-1 through 5-4 were measured as in the case of Examples 1-1 through 1-5. The results are shown in Table 11. Moreover, when the Curie temperatures of the piezoelectric ceramics of Examples 5-1 through 5-4 were measured, they were within a range of 310° C. to 340° C.

$$Pb_a[(Zn_{b/3}Nb_{2/3})_{0.1}Ti_{0.44}Zr_{0.46}]O_3 \quad \text{(Chemical Formula 7)}$$

TABLE 11

| | COMPOSITION OF CHEMICAL FORMULA 7 | | CONTENT OF SUB-COMPONENT Sb (mass %) | FIRING ATMOSPHERE | FIRING TEMPERATURE (° C.) | ELECTROMECHANICAL COUPLING FACTOR kr (%) | RELATIVE DIELECTRIC CONSTANT $\epsilon r$ | $kr \times \sqrt{\epsilon r}$ |
|---|---|---|---|---|---|---|---|---|
| | a | b | | | | | | |
| EXAMPLE 5-1 | 0.94 | 1.5 | — | LOW OXYGEN REDUCTION | 1020 | 61.9 | 1724 | 25.7 |
| EXAMPLE 5-2 | 0.98 | 1.3 | — | LOW OXYGEN REDUCTION | 1020 | 69.9 | 1901 | 30.5 |
| EXAMPLE 5-3 | 1.02 | 1.3 | — | LOW OXYGEN REDUCTION | 1020 | 59.1 | 1729 | 24.6 |
| EXAMPLE 5-4 | 0.98 | 1.3 | 0.4 | LOW OXYGEN REDUCTION | 980 | 70.5 | 1872 | 30.5 |
| EXAMPLE 2-1 | 0.94 | 1.5 | — | AIR | 1020 | 62.7 | 1738 | 26.1 |

TABLE 11-continued

| | COMPOSITION OF CHEMICAL FORMULA 7 | | CONTENT OF SUB-COMPONENT Sb | FIRING | FIRING | ELECTROMECHANICAL COUPLING | RELATIVE DIELECTRIC | |
|---|---|---|---|---|---|---|---|---|
| | | | | | TEMPERATURE | FACTOR | CONSTANT | kr × |
| | a | b | (mass %) | ATMOSPHERE | (° C.) | kr (%) | ∈r | $\sqrt{\epsilon r}$ |
| EXAMPLE 1-2 | 0.98 | 1.3 | — | AIR | 1020 | 70.2 | 1896 | 30.6 |
| EXAMPLE 2-4 | 1.02 | 1.3 | — | AIR | 1020 | 58.9 | 1734 | 24.5 |
| EXAMPLE 4-3 | 0.98 | 1.3 | 0.4 | AIR | 960 | 70.9 | 1880 | 30.7 |

As shown in Table 11, in Examples 5-1 through 5-4 in which firing was carried out at a low oxygen reducing atmosphere, the same results as those in Examples 2-1, 1-2, 2-4 and 4-3 in which firing was carried out in an air atmosphere were obtained. In other words, it was found out that even if firing was carried out in a low oxygen reducing atmosphere, high piezoelectric properties could be obtained.

$Pb_{0.98}[(Zn_{1.3/3}Nb_{2/3})_{0.1}Ti_{0.44}Zr_{0.46}]O_3$     (Chemical Formula 8)

$(Pb_{0.97}Sr_{0.02})[(Zn_{1/3}Nb_{2/3})_{0.1}Ti_{0.43}Zr_{0.47}]O_3$     (Chemical Formula 9)

TABLE 12

| | SUB-COMPONENT | | FIRING | ELECTROMECHANICAL COUPLING | RELATIVE DIELECTRIC | | | AMOUNT OF DISPLACEMENT 2 μm | |
|---|---|---|---|---|---|---|---|---|---|
| | KIND | CONTENT (mass %) | TEMPERATURE (° C.) | FACTOR kr (%) | CONSTANT ∈r | kr × $\sqrt{\epsilon r}$ | VOLATAGE (V) | | EFFECTIVE VALUE OF CURRENT (mA) |
| EXAMPLE 6 | Sb | 0.4 | 960 | 70.9 | 1880 | 30.7 | 88 | | 6.5 |
| COMPARATIVE EXAMPLE 6 | Ta | 0.4 | 1100 | 67.2 | 2199 | 31.5 | 87 | | 7.5 |

Example 6

A multilayer piezoelectric device shown in FIG. 1 was formed through the use of the piezoelectric ceramic of Example 4-3, that is, a piezoelectric ceramic including a composition represented by Chemical Formula 8 as a main component and 0.4 mass % of antimony in the form of oxide ($Sb_2O_3$) in proportion to the main component. The piezoelectric layer 11 sandwiched between the internal electrodes 12 had a thickness of 50 μm, and the number of layers in the piezoelectric device was 50, and the layers had a size of 10 mm height by 10 mm wide. The internal electrodes 12 were made of a silver-palladium alloy, and the firing temperature was 960° C. A sine-wave voltage of 20 Hz was applied to the obtained piezoelectric device to measure the voltage and the effective value of a current when an amount of displacement of 2 μm was obtained. The results are shown in Table 12.

As Comparative Example 6 relative to Example 6, a piezoelectric device was formed as in the case of Example 6, except that a piezoelectric ceramic including a composition represented by Chemical Formula 9 as a main component and 0.4 mass % of tantalum in the form of oxide ($Ta_2O_5$) in proportion to the main component as a sub-component was used. Moreover, the firing temperature was 1100° C. at which the highest properties could be obtained. The voltage and the effective value of a current of the piezoelectric device of Comparative Example 6 when an amount of displacement of 2μ was obtained were measured as in the case of Example 6. The results are shown in Table 12.

As shown in Table 12, in Example 6, even if the firing temperature was as low as 960° C., the same sufficient piezoelectric properties as those in Comparative Example 6 which was a conventional piezoelectric device could be obtained, and compared to Comparative Example 6, the relative dielectric constant ∈r could be smaller, and a current flowing through the piezoelectric device could be smaller. In other words, it was found out that when the piezoelectric ceramic included a composition in which zinc larger than the stoichiometric composition was included, and the composition x of zinc and niobium was within a range of $0.05 \leq x < 0.125$ as a main component, even if the firing temperature was low, the piezoelectric properties could be improved, and an energy required for driving could be kept low, and in particular, when antimony was added as a sub-component, a higher effect could be obtained.

Examples 7-1 through 7-5

Piezoelectric ceramics including a composition represented by Chemical Formula 10 as a main component were formed. At first, as materials of the main component, a lead oxide powder, a strontium carbonate powder, a titanium oxide powder, a zirconium oxide powder, a zinc oxide powder and a niobium oxide powder were prepared and weighed so as to have the composition represented by Chemical Formula 10. At that time, the value of g in Chemical Formula 10, that is, the composition g/3 of zinc was changed as shown in Table 13 in Examples 7-1 through 7-5.

Next, after the materials were wet-mixed by the ball mill for 16 hours, they were pre-fired in air at 700° C. to 900° C. for 2 hours. Next, the pre-fired body was wet-pulverized by the ball mill for 16 hours and dried. After that, polyvinyl alcohol as a binder was added to the pre-fired body to granulate the pre-fired body, and then the granulated body was molded into a disk shape with a diameter of 17 mm and a thickness of 1 mm through applying a pressure of approximately 245 MPa through the use of the uniaxial press molding apparatus. After molding, the molded body was heated to volatilize the binder, then the molded body was fired in air at 1050° C. for 2 hours to 8 hours. After that, the obtained sintered body was sliced and lapped to form into a disk shape with a thickness of 0.6 mm, and a silver paste was printed on both sides of the sintered body and was fired at 650° C. Then, an electric field of 3 kV/mm was applied to the sintered body in a silicone oil of 120° C. for 15 minutes to carry out polarization. Thereby, the piezoelectric ceramics of Examples 7-1 through 7-5 were obtained.

Figure 5:
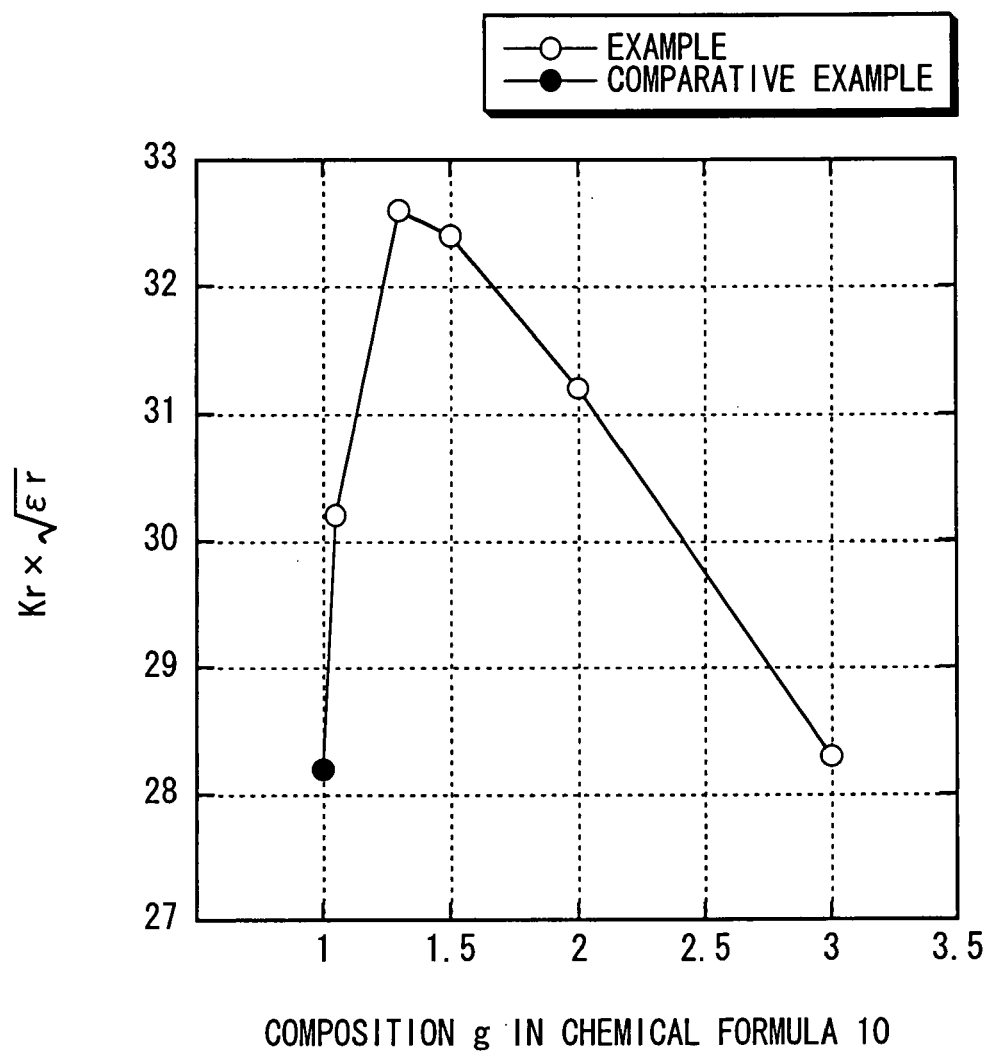
FIG. 5 is a plot showing a relationship between a composition g in Chemical Formula 10 and $krx\sqrt{\in r}$.

After the obtained piezoelectric ceramics of Examples 7-1 through 7-5 were left for 24 hours, the electromechanical coupling factor kr for radial vibration and the relative dielectric constant ∈r of the piezoelectric ceramics of Examples 7-1 through 7-5 were measured. They were measured by the impedance analyzer (Hewlett-Packard's HP4194A), and a frequency when measuring the relative dielectric constant ∈r was 1 kHz. The obtained results are shown in Table 13 and FIG. 5.

$$(Pb_{0.9}Sr_{0.03})[(Zn_{g/3}Nb_{2/3})_{0.1}Ti_{0.43}Zr_{0.47}]O_3 \quad \text{(Chemical Formula 10)}$$

in Table 13 and the FIG. 5, in Examples 7-1 through 7-5, $kr \times \sqrt{\in r}$ could be increased, compared to Comparative Example 7-1. Further, there was a tendency that as the value of g increased, $kr \times \sqrt{\in r}$ increased to the maximum value, then decreased.

In other words, it was found out that when the value of g was within a range from greater than 1 to 3, the firing temperature could be lowered to 1050° C. or less, and the piezoelectric properties could be improved. Moreover, it was found out that the value of g was more preferably within a range from 1.05 to 2.0.

Examples 8-1 through 8-4

As in the case of Examples 7-1 through 7-5, piezoelectric ceramics including a composition represented by Chemical Formula 11 as a main component were formed. At that time, in Examples 8-1 through 8-4, the values of e, g, v and w in Chemical Formula 11 were changed as shown in Tables 14 through 17. In Examples 8-1 through 8-4, the composition u of zinc and niobium was fixed to 0.1, and the composition e of lead and strontium was changed, and the value of g, v and w were compositions where $kr \times \sqrt{\in r}$ was the largest.

TABLE 13

| | COMPOSITION OF CHEMICAL FORMULA 10 g | FIRING TEMPERATURE (° C.) | ELECTROMECHANICAL COUPLING FACTOR kr (%) | RELATIVE DIELECTRIC CONSTANT ∈r | $kr \times \sqrt{\in r}$ |
|---|---|---|---|---|---|
| EXAMPLE 7-1 | 1.05 | 1050 | 65.9 | 2101 | 30.2 |
| EXAMPLE 7-2 | 1.3 | 1050 | 67.8 | 2310 | 32.6 |
| EXAMPLE 7-3 | 1.5 | 1050 | 67.5 | 2305 | 32.4 |
| EXAMPLE 7-4 | 2.0 | 1050 | 65.4 | 2273 | 31.2 |
| EXAMPLE 7-5 | 3.0 | 1050 | 61.7 | 2106 | 28.3 |
| COMPARATIVE EXAMPLE 7-1 | 1.0 | 1150 | 65.5 | 1850 | 28.2 |

As Comparative Example 7-1 relative to the examples, a piezoelectric ceramic was formed as in the case of Examples 7-1 through 7-5, except that the value of g in Chemical Formula 10 was 1, and the firing temperature was 1150° C. at which the highest properties could be obtained. The electromechanical coupling factor kr for radial vibration and the relative dielectric constant ∈r of the piezoelectric ceramic of Comparative Example 7-1 were measured as in the case of Examples 7-1 through 7-5. The results are also shown in Table 13 and FIG. 5.

As shown in Table 13, in Examples 7-1 through 7-5, firing could be carried out at a low temperature of 1050° C.; however, in Comparative Example 7-1, the firing temperature could be lowered to only 1150° C. Moreover, as shown Moreover, as Comparative Examples 8-1 through 8-4 relative to Examples 8-1 through 8-4, piezoelectric ceramics were formed as in the case of Examples 8-1 through 8-4, except that the value of g in Chemical Formula 11 was 1, and the firing temperature was 1100° C. or 1150° C. at which the highest properties could be obtained. Comparative Examples 8-1, 8-2, 8-3 and 8-4 correspond to Examples 8-1, 8-2, 8-3 and 8-4, respectively.

The electromechanical coupling factor kr for radial vibration and the relative dielectric constant ∈r of the piezoelectric ceramics of Examples 8-1 through 8-4 and Comparative Examples 8-1 through 8-4 were measured as in the caes of Examples 7-1 through 7-5. The results are shown in Tables 14 through 17.

$$(Pb_{e.0.03}Sr_{0.03})[(Zn_{g/3}Nb_{2/3})_{0.1}Ti_vZr_w]O_3 \quad \text{(Chemical Formula 11)}$$

TABLE 14

| | COMPOSITION OF CHEMICAL FORMULA 11 | | | | FIRING TEMPERATURE (° C.) | ELECTROMECHANICAL COUPLING FACTOR kr (%) | RELATIVE DIELECTRIC CONSTANT ∈r | $kr \times \sqrt{\in r}$ |
|---|---|---|---|---|---|---|---|---|
| | e | g | v | w | | | | |
| EXAMPLE 8-1 | 0.96 | 1.3 | 0.42 | 0.48 | 1050 | 62.3 | 2257 | 29.6 |
| COMPARATIVE EXAMPLE 8-1 | 0.96 | 1.0 | 0.42 | 0.48 | 1100 | 61.1 | 1981 | 27.2 |

TABLE 15

| | COMPOSITION OF CHEMICAL FORMULA 11 | | | | FIRING TEMPERATURE | ELECTROMECHANICAL COUPLING FACTOR | RELATIVE DIELECTRIC CONSTANT | |
|---|---|---|---|---|---|---|---|---|
| | e | g | v | w | (° C.) | kr (%) | $\epsilon r$ | $kr \times \sqrt{\epsilon r}$ |
| EXAMPLE 8-2 | 0.99 | 1.3 | 0.43 | 0.47 | 1050 | 65.6 | 2346 | 31.8 |
| COMPARATIVE EXAMPLE 8-2 | 0.99 | 1.0 | 0.43 | 0.47 | 1150 | 63.8 | 2029 | 28.7 |

TABLE 16

| | COMPOSITION OF CHEMICAL FORMULA 11 | | | | FIRING TEMPERATURE | ELECTROMECHANICAL COUPLING FACTOR | RELATIVE DIELECTRIC CONSTANT | |
|---|---|---|---|---|---|---|---|---|
| | e | g | v | w | (° C.) | kr (%) | $\epsilon r$ | $kr \times \sqrt{\epsilon r}$ |
| EXAMPLE 8-3 | 1.01 | 1.1 | 0.43 | 0.47 | 1050 | 65.4 | 2125 | 30.1 |
| COMPARATIVE EXAMPLE 8-3 | 1.01 | 1.0 | 0.43 | 0.47 | 1150 | 63.5 | 1848 | 27.3 |

TABLE 17

| | COMPOSITION OF CHEMICAL FORMULA 11 | | | | FIRING TEMPERATURE | ELECTROMECHANICAL COUPLING FACTOR | RELATIVE DIELECTRIC CONSTANT | |
|---|---|---|---|---|---|---|---|---|
| | e | g | v | w | (° C.) | kr (%) | $\epsilon r$ | $kr \times \sqrt{\epsilon r}$ |
| EXAMPLE 8-4 | 1.03 | 1.1 | 0.43 | 0.47 | 1050 | 62.7 | 2121 | 28.9 |
| COMPARATIVE EXAMPLE 8-4 | 1.03 | 1.0 | 0.43 | 0.47 | 1150 | 61.8 | 1845 | 26.5 |

As shown in Tables 14 through 17, in Examples 8-1 through 8-4, as in the case of Examples 7-1 through 7-5, the firing temperature could be lowered to 1050° C., and compared to Comparative Examples 8-1 through 8-4, $kr \times \sqrt{\epsilon r}$ could be increased.

Figure 6:
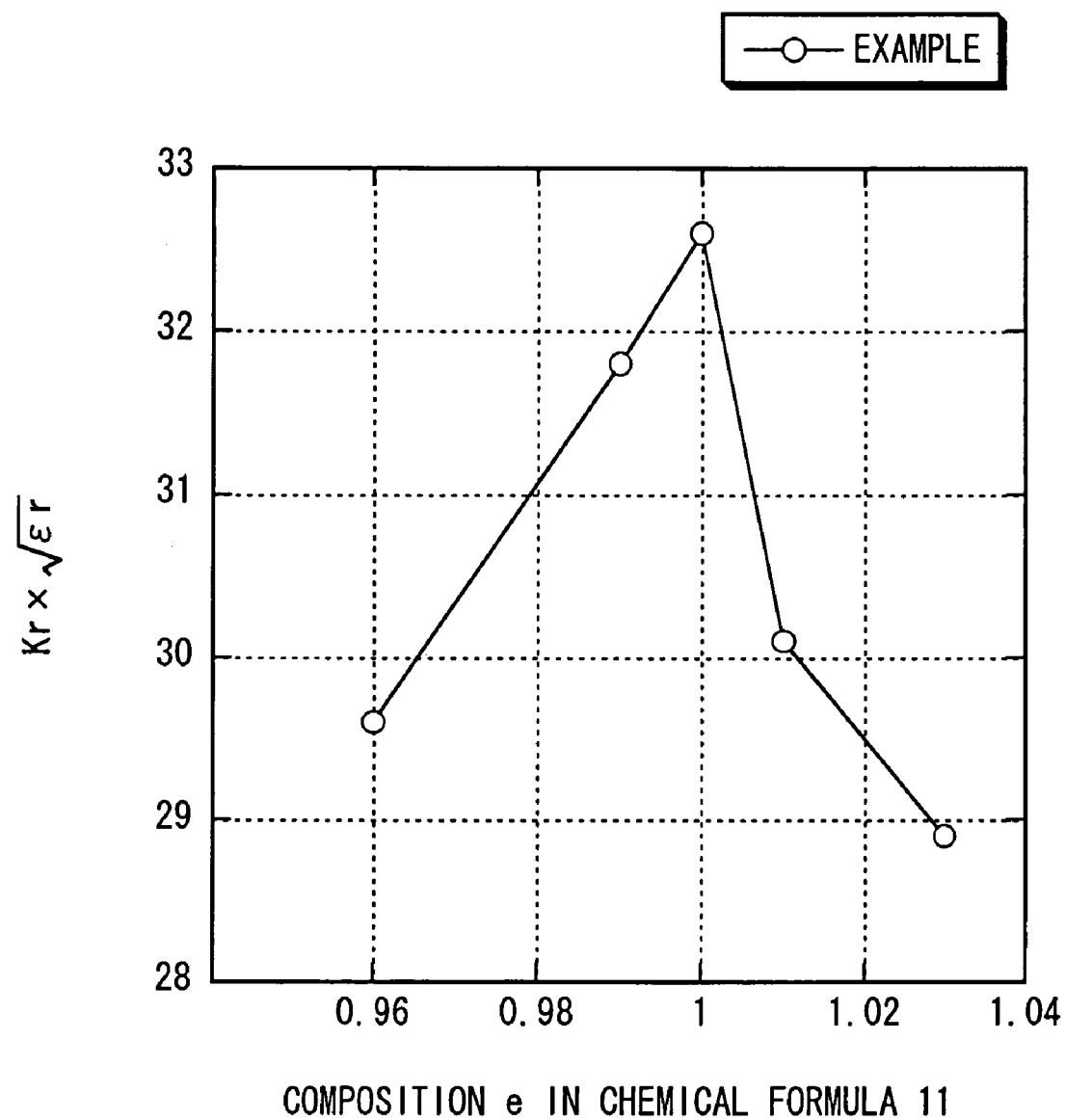
FIG. 6 is a plot showing a relationship between a composition e in Chemical Formula 11 and $krx\sqrt{\in r}$.

Moreover, a relationship between the composition e in Chemical Formula 11, that is, the composition of lead and strontium and $kr \times \sqrt{\epsilon r}$ in Examples 8-1 through 8-4 and Example 7-2 is shown in FIG. 6. As shown in FIG. 6, there was a tendency that as the value of e increased, $kr \times \sqrt{\epsilon r}$ increased to the maximum value, then decreased. In other words, it was found out that when the value of e was within a range from 0.96 to 1.03, the piezoelectric properties could be further improved. Moreover, it was found out that the value of e was more preferably within a range from 0.96 to 1.01.

Examples 9-1 through 9-4

As in the case of Examples 7-1 through 7-5, piezoelectric ceramics including a composition represented by Chemical Formula 12 as a main component were formed. At that time, in Examples 9-1 through 9-4, the values of g, u, v and w were changed as shown in Tables 18 through 21. In Examples 9-1 through 9-4, the composition e of lead and strontium was fixed to 1, and the composition u of zinc and niobium was changed, and the value of g, v and w were compositions where $kr \times \sqrt{\epsilon r}$ was the largest.

Moreover, as Comparative Examples 9-1 through 9-4 relative to Examples 9-1 through 9-4, piezoelectric ceramics were formed as in the case of Examples 9-1 through 9-4, except that the value of g in Chemical Formula 12 was 1, and the firing temperature was 1150° C. at which the highest properties could be obtained. Comparative Examples 9-1, 9-2, 9-3 and 9-4 correspond to Examples 9-1, 9-2, 9-3 and 9-4, respectively.

The electromechanical coupling factor kr for radial vibration and the relative dielectric constant $\epsilon r$ of the piezoelectric ceramics of Examples 9-1 through 9-4 and Comparative Examples 9-1 through 9-4 were measured as in the case of Examples 7-1 through 7-5. The results are shown in Tables 18 through 21.

$(Pb_{0.97}Sr_{0.03})[(Zn_{g/3}Nb_{2/3})_u Ti_v Zr_w]O_3$     (Chemical Formula 12)

TABLE 18

| | COMPOSITION OF CHEMICAL FORMULA 12 | | | | FIRING TEMPERATURE | ELECTROMECHANICAL COUPLING FACTOR | RELATIVE DIELECTRIC CONSTANT | |
|---|---|---|---|---|---|---|---|---|
| | g | u | v | w | (° C.) | kr (%) | $\epsilon r$ | kr × $\sqrt{\epsilon r}$ |
| EXAMPLE 9-1 | 1.3 | 0.05 | 0.44 | 0.51 | 1050 | 62.7 | 2113 | 28.8 |
| COMPARATIVE EXAMPLE 9-1 | 1.0 | 0.05 | 0.44 | 0.51 | 1150 | 60.5 | 1770 | 25.5 |

TABLE 19

| | COMPOSITION OF CHEMICAL FORMULA 12 | | | | FIRING TEMPERATURE | ELECTROMECHANICAL COUPLING FACTOR | RELATIVE DIELECTRIC CONSTANT | |
|---|---|---|---|---|---|---|---|---|
| | g | u | v | w | (° C.) | kr (%) | $\epsilon r$ | kr × $\sqrt{\epsilon r}$ |
| EXAMPLE 9-2 | 1.3 | 0.08 | 0.43 | 0.49 | 1050 | 63.5 | 2195 | 29.8 |
| COMPARATIVE EXAMPLE 9-2 | 1.0 | 0.08 | 0.43 | 0.49 | 1150 | 61.3 | 1811 | 26.1 |

TABLE 20

| | COMPOSITION OF CHEMICAL FORMULA 12 | | | | FIRING TEMPERATURE | ELECTROMECHANICAL COUPLING FACTOR | RELATIVE DIELECTRIC CONSTANT | |
|---|---|---|---|---|---|---|---|---|
| | g | u | v | w | (° C.) | kr (%) | $\epsilon r$ | kr × $\sqrt{\epsilon r}$ |
| EXAMPLE 9-3 | 1.5 | 0.12 | 0.43 | 0.45 | 1050 | 61.9 | 2334 | 29.9 |
| COMPARATIVE EXAMPLE 9-3 | 1.0 | 0.12 | 0.43 | 0.45 | 1150 | 60.5 | 1967 | 26.8 |

TABLE 21

| | COMPOSITION OF CHEMICAL FORMULA 12 | | | | FIRING TEMPERATURE | ELECTROMECHANICAL COUPLING FACTOR | RELATIVE DIELECTRIC CONSTANT | |
|---|---|---|---|---|---|---|---|---|
| | g | u | v | w | (° C.) | kr (%) | $\epsilon r$ | kr × $\sqrt{\epsilon r}$ |
| EXAMPLE 9-4 | 1.5 | 0.124 | 0.43 | 0.446 | 1050 | 61.5 | 2338 | 29.7 |
| COMPARATIVE EXAMPLE 9-4 | 1.0 | 0.124 | 0.43 | 0.446 | 1150 | 60.1 | 1974 | 26.7 |

As shown in Tables 18 through 21, in Examples 9-1 through 9-4, as in the case of Examples 7-1 through 7-5, the firing temperature could be lowered to 1050° C., and compared to Comparative Examples 9-1 through 9-4, kr×$\sqrt{\epsilon r}$ could be increased.

Figure 7:
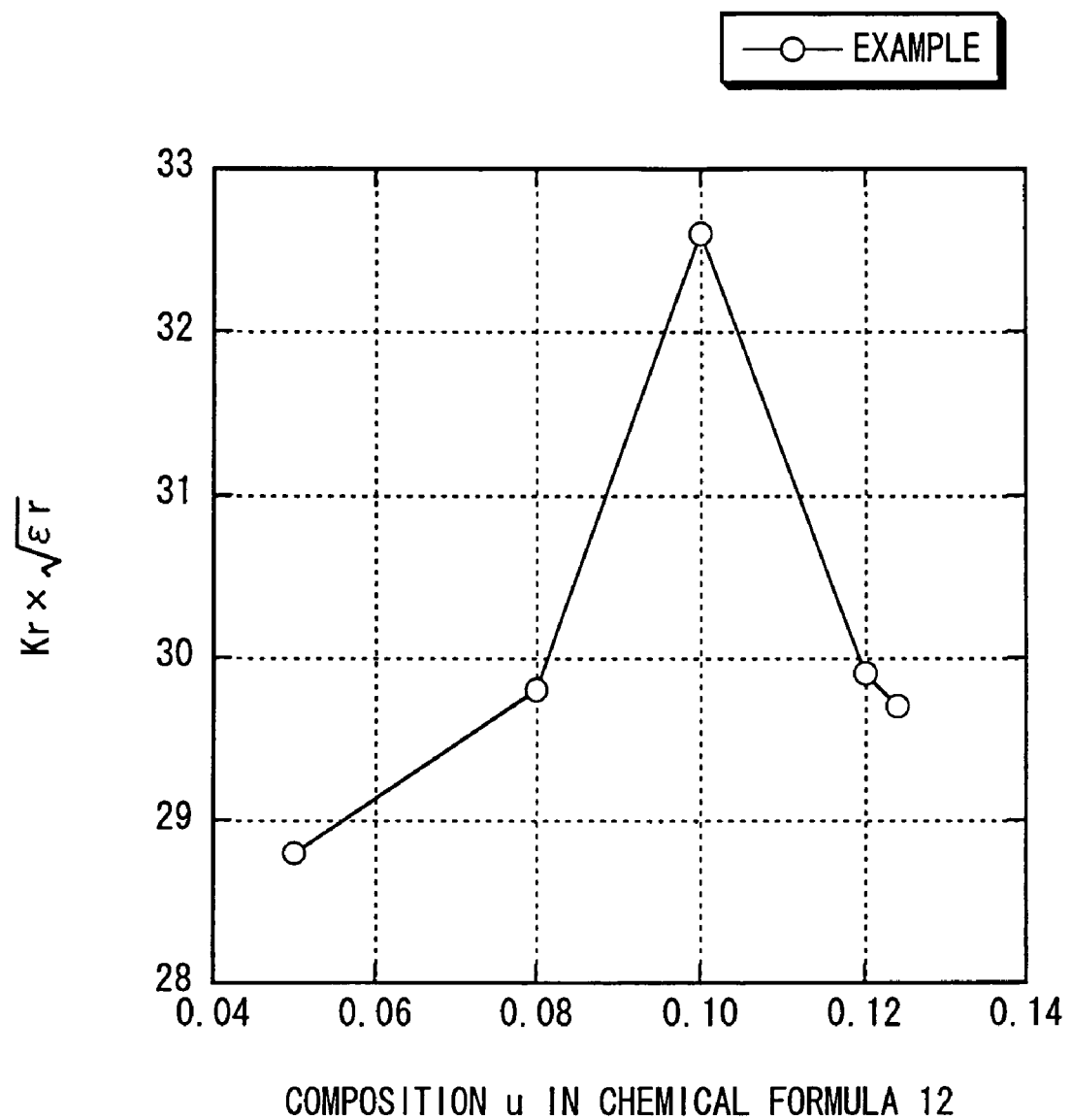
FIG. 7 is a plot showing a relationship between a composition u in Chemical Formula 12 and $krx\sqrt{\in r}$.

Moreover, a relationship between the composition u in Chemical Formula 12, that is, the composition of zinc and niobium and kr×$\sqrt{\epsilon r}$ in Examples 9-1 through 9-4 and Example 7-2 is shown in FIG. 7. As shown in FIG. 7, there was a tendency that as the value of u increased, kr×$\sqrt{\epsilon r}$ increased to the maximum value, then decreased. In other words, it was found out that when the value of u was within a range from 0.05 to less than 0.125, the piezoelectric properties could be improved. Moreover, it was found out that the value of u was more preferably within a range from 0.08 to 0.124.

Examples 10-1, 10-2

As in the case of Examples 7-1 through 7-5, piezoelectric ceramics including a composition represented by Chemical Formula 13 as a main component were formed. At that time, in Examples 10-1 and 10-2, Me and the value of g in Chemical Formula 13 were changed as shown in Tables 22 and 23. In Examples 10-1 and 10-2, instead of strontium, barium or calcium was substituted for a part of lead, and the value of g was a composition where kr×$\sqrt{\epsilon r}$ was the largest. At that time, as the material of barium, a barium carbonate powder was used, and as the material of calcium, a calcium carbonate powder was used.

Moreover, as Comparative Examples 10-1 and 10-2 relative to Examples 10-1 and 10-2, piezoelectric ceramics were formed as in the case of Examples 10-1 and 10-2, except that the value of g in Chemical Formula 13 was 1, and the firing temperature was 1150° C. at which the highest properties could be obtained. Comparative Examples 10-1 and 10-2 correspond to Examples 10-1 and 10-2, respectively.

The electromechanical coupling factor kr for radial vibration and the relative dielectric constant $\epsilon r$ of the piezoelectric ceramics of Examples 10-1 and 10-2 and Comparative Examples 10-1 and 10-2 were measured as in the case of Examples 7-1 through 7-5. The results are shown in Tables 22 and 23.

$$(Pb_{0.97}Me_{0.02})[(Zn_{g/3}Nb_{2/3})_{0.1}Ti_{0.43}Zr_{0.47}]O_3 \text{ (Chemical Formula 13)}$$

TABLE 22

| | COMPOSITION OF CHEMICAL FORMULA 13 | | FIRING TEMPERATURE | ELECTROMECHANICAL COUPLING FACTOR | RELATIVE DIELECTRIC CONSTANT | |
|---|---|---|---|---|---|---|
| | Me | g | (° C.) | kr (%) | $\epsilon r$ | $kr \times \sqrt{\epsilon r}$ |
| EXAMPLE 10-1 | Ba | 1.3 | 1050 | 64.9 | 2305 | 31.2 |
| COMPARATIVE EXAMPLE 10-1 | Ba | 1.0 | 1150 | 63.1 | 1980 | 28.1 |

TABLE 23

| | COMPOSITION OF CHEMICAL FORMULA 13 | | FIRING TEMPERATURE | ELECTROMECHANICAL COUPLING FACTOR | RELATIVE DIELECTRIC CONSTANT | |
|---|---|---|---|---|---|---|
| | Me | g | (° C.) | kr (%) | $\epsilon r$ | $kr \times \sqrt{\epsilon r}$ |
| EXAMPLE 10-2 | Ca | 1.5 | 1050 | 64.3 | 2309 | 30.9 |
| COMPARATIVE EXAMPLE 10-2 | Ca | 1.0 | 1150 | 62.6 | 1985 | 27.9 |

As shown in Tables 22 and 23, in Examples 10-1 and 10-2, as in the case of Examples 7-1 and 7-5, the firing temperature could be lowered to 1050° C., and compared to Comparative Examples 10-1 and 10-2, $kr \times \sqrt{\epsilon r}$ could be increased. In other words, it was found out that when barium or calcium was substituted for a part of lead, the same effect could be obtained.

Examples 11-1 through 11-12

As in the case of Examples 7-1 through 7-5, piezoelectric ceramics including a composition represented by Chemical Formula 14 as a main component and one selected from the group consisting of tantalum, antimony, niobium, tungsten, molybdenum, iron, cobalt, nickel and chromium as a sub-component were formed. As the sub-component, tantalum in Examples 11-1 through 11-4, antimony in Example 11-5, niobium in Example 11-6, tungsten in Example 11-7, molybdenum in Example 11-8, iron in Example 11-9, cobalt in Example 11-10, nickel in Example 11-11, and chromium in Example 11-12 were included, and as their materials, a tantalum oxide powder, an antimony oxide powder, a niobium oxide powder, a tungsten oxide powder, a molybdenum oxide powder, an iron oxide powder, a cobalt oxide powder, a nickel oxide powder, and a chromium oxide powder were used. The content of the sub-component in the form of oxide ($Ta_2O_5$, $Sb_2O_3$, $Nb_2O_5$, $WO_3$, $MoO_3$, $Fe_2O_3$, $Co_3O_4$, $NiO$, $Cr_2O_3$) in proportion to the main component was changed as shown in Table 24 in Examples 11-1 through 11-12. Moreover, the firing temperature was changed as shown in Table 24 so that the highest properties could be obtained.

The electromechanical coupling factor kr for radial vibration the relative dielectric constant $\epsilon r$ of the piezoelectric ceramics of Examples 11-1 through 11-12 were measured as in the case of Examples 7-1 through 7-5. The results are shown in Table 24 together with the result of Example 7-2 in which no sub-component was added.

$$(Pb_{0.97}Sr_{0.03})[(Zn_{1.3/3}Nb_{2/3})_{0.1}Ti_{0.43}Zr_{0.47}]O_3 \text{(Chemical Formula 14)}$$

TABLE 24

| | SUB-CONTENT | | FIRING TEMPERATURE (° C.) | ELECTROMECHANICAL COUPLING FACTOR kr (%) | RELATIVE DIELECTRIC CONSTANT | |
|---|---|---|---|---|---|---|
| | KIND | CONTENT (mass %) | | | $\epsilon r$ | $kr \times \sqrt{\epsilon r}$ |
| EXAMPLE 7-2 | — | — | 1050 | 67.8 | 2310 | 32.6 |
| EXAMPLE 11-1 | Ta | 0.01 | 1020 | 68.0 | 2348 | 33.0 |
| EXAMPLE 11-2 | Ta | 0.05 | 1020 | 68.0 | 2384 | 33.2 |
| EXAMPLE 11-3 | Ta | 0.4 | 1020 | 70.9 | 2567 | 35.9 |
| EXAMPLE 11-4 | Ta | 1.0 | 1050 | 67.3 | 2360 | 32.7 |
| EXAMPLE 11-5 | Sb | 0.4 | 1020 | 69.0 | 2355 | 33.5 |
| EXAMPLE 11-6 | Nb | 0.4 | 1020 | 68.3 | 2410 | 33.5 |
| EXAMPLE 11-7 | W | 0.6 | 1050 | 69.4 | 2413 | 34.1 |
| EXAMPLE 11-8 | Mo | 0.1 | 1020 | 67.9 | 2315 | 32.7 |
| EXAMPLE 11-9 | Fe | 0.1 | 1020 | 68.0 | 2311 | 32.7 |
| EXAMPLE 11-10 | Co | 0.2 | 1020 | 68.3 | 2320 | 32.9 |
| EXAMPLE 11-11 | Ni | 0.3 | 1020 | 68.5 | 2386 | 33.5 |
| EXAMPLE 11-12 | Cr | 0.2 | 1020 | 68.2 | 2316 | 32.8 |

As shown in Table 24, in Examples 11-1 through 11-12, in which as the sub-component, tantalum, antimony, niobium, tungsten, molybdenum, iron, cobalt, nickel or chromium was added, compared to Example 7-2 in which no sub-component was added, the firing temperature could be further lowered to 1020° C. depending upon the kind and the content of the sub-component, and kr×√∈r could be further increased. In particular, when tantalum was added, a large effect could be obtained.

In other words, it was found out that when tantalum, antimony, niobium, tungsten, molybdenum, iron, cobalt, nickel or chromium was added as the sub-component, depending upon the sub-component, the firing temperature could be lower, or the piezoelectric properties could be further improved. Moreover, it was found out that when tantalum among them was added, a higher effect could be obtained.

Examples 12-1 through 12-4

Piezoelectric ceramics including a composition represented by Chemical Formula 15 as a main component were formed as in the case of Examples 7-1 through 7-5, except that firing was carried out in a low oxygen reducing atmosphere of $1\times10^{-3}$ Pa or more in which the oxygen partial pressure was lower than air. At that time, in Examples 12-1 through 12-4, the values of e, g v and w in Chemical Formula 15 were changed as shown in Table 25. Moreover, in Example 12-4, 0.4 mass % of tantalum in the form of oxide ($Ta_2O_5$) in proportion to the main component was added. The firing temperature was 1050° C. in Examples 12-1 through 12-3, and 1020° C. in Example 12-4.

The electromechanical coupling factor kr for radial vibration and the relative dielectric constant ∈r of the piezoelectric ceramics of Examples 12-1 through 12-4 were measured as in the case of Examples 7-1 through 7-5. The results are shown in Table 25 together with the results of Examples 8-1, 7-2, 8-4 and 11-3.

As shown in Table 25, in Examples 12-1 through 12-4 in which firing was carried out at a low oxygen reducing atmosphere, the same results as those in Examples 8-1, 7-2, 8-4 and 11-3 in which firing was carried out in an air atmosphere were obtained. In other words, it was found out that even if firing was carried out in a low oxygen reducing atmosphere, high piezoelectric properties could be obtained.

Example 13

A multilayer piezoelectric device shown in FIG. 1 was formed through the use of the piezoelectric ceramic of Example 11-3, that is, a piezoelectric ceramic including a composition in which the value of g in Chemical Formula 16 was 1.3 as a main component and 0.4 mass % of tantalum in the form of oxide ($Ta_2O_5$) in proportion to the main component as a sub-component. The piezoelectric layer 11 sandwiched between the internal electrodes 12 had a thickness of 25 µm, and the number of layers in the piezoelectric device was 10, and the layers had a size of 4 mm height by 4 mm wide. The internal electrodes 12 were made of a silver-palladium alloy, and the firing temperature was 1020° C. The amount of displacement of the obtained piezoelectric device in the case where a voltage of 40 V was applied was measured. The result is shown in Table 26.

As Comparative Example 13 relative to Example 13, a piezoelectric device was formed as in the case of Example 13, except that tantalum as the sub-component was not added. The firing temperature was 1150° C. at which the highest properties could be obtained. The amount of displacement of the obtained piezoelectric device of Comparative Example 13 in the case where a voltage of 40 V was applied was measured as in the case of Example 13. The result is also shown in Table 26.

$(Pb_{e-0.03}Sr_{0.03})[(Zn_{g/3}Nb_{2/3})_{0.1}Ti_vZr_w]O_3$ (Chemical Formula 15)

$(Pb_{0.97}Sr_{0.03})[(Zn_{g/3}Nb_{2/3})_{0.1}Ti_{0.43}Zr_{0.47}]O_3$ (Chemical Formula 16)

TABLE 25

| | COMPOSITION OF CHEMICAL FORMULA 15 | | | | CONTENT OF SUB-COMPONENT Ta | FIRING | FIRING TEMPERATURE | ELECTRO-MECHANICAL COUPLING FACTOR | RELATIVE DIELECTRIC CONSTANT | |
|---|---|---|---|---|---|---|---|---|---|---|
| | e | g | v | w | (mass %) | ATMOSPHERE | (° C.) | kr (%) | ∈r | kr × √∈r |
| EXAMPLE 12-1 | 0.96 | 1.3 | 0.42 | 0.48 | — | LOW OXYGEN REDUCTION | 1050 | 61.7 | 2244 | 29.2 |
| EXAMPLE 12-2 | 1.0 | 1.3 | 0.43 | 0.47 | — | LOW OXYGEN REDUCTION | 1050 | 67.3 | 2307 | 32.3 |
| EXAMPLE 12-3 | 1.03 | 1.1 | 0.43 | 0.47 | — | LOW OXYGEN REDUCTION | 1050 | 62.9 | 2156 | 29.2 |
| EXAMPLE 12-4 | 1.0 | 1.3 | 0.43 | 0.47 | 0.4 | LOW OXYGEN REDUCTION | 1020 | 70.6 | 2570 | 35.8 |
| EXAMPLE 8-1 | 0.96 | 1.3 | 0.42 | 0.48 | — | AIR | 1050 | 62.3 | 2257 | 29.6 |
| EXAMPLE 7-2 | 1.0 | 1.3 | 0.43 | 0.47 | — | AIR | 1050 | 67.8 | 2310 | 32.6 |
| EXAMPLE 8-4 | 1.03 | 1.1 | 0.43 | 0.47 | — | AIR | 1050 | 62.7 | 2121 | 28.9 |
| EXAMPLE 11-3 | 1.0 | 1.3 | 0.43 | 0.47 | 0.4 | AIR | 1020 | 70.9 | 2567 | 35.9 |

TABLE 26

| | COMPOSITION OF CHEMICAL FORMULA 16 g | CONTENT OF SUB-COMPONENT Ta (mass %) | FIRING TEMPERATURE (° C.) | ELECTRO-MECHANICAL COUPLING FACTOR kr (%) | RELATIVE DIELECTRIC CONSTANT εr | kr × √εr | AMOUNT OF DISPLACMENT (nm) |
|---|---|---|---|---|---|---|---|
| EXAMPLE 13 | 1.3 | 0.4 | 1020 | 70.9 | 2567 | 35.9 | 205 |
| COMPARATIVE EXAMPLE 13 | 1.0 | — | 1150 | 65.5 | 1850 | 28.2 | 161 |

As shown in Table 26, in Example 13, the firing temperature could be lowered to 1020° C., and a larger amount of displacement than that in Comparative Example 13 which was a conventional piezoelectric device could be obtained. In other words, it was found out that when the piezoelectric ceramic included a composition in which at least one kind selected from the group consisting of strontium, barium and calcium was substituted for a part of lead, and zinc larger than the stoichiometric composition was included, and the composition u of zinc and niobium was within a range of $0.05 \leq u < 0.125$ as a main component, the firing temperature could be lower, and the piezoelectric properties could be further improved, and in particular, when tantalum was added as a sub-component, a higher effect could be obtained.

In the above examples, the invention is described in detail referring to some examples. However, even if the compositions of the main component and the sub-component are changed, as long as the compositions are within the ranges described in the above embodiments, the same result can be obtained.

Although the invention is described referring to the embodiments and the examples, the invention is not limited to them, and can be variously modified. For example, in the above embodiments and the above examples, the case where the piezoelectric ceramic includes the main component represented by Chemical Formula 1 or 2 and, if necessary, at least one kind selected from the group consisting of antimony, tantalum, niobium, tungsten, molybdenum, iron, cobalt, nickel and chromium is described; however, in addition to them, any other component may be included. In this case, the component may or may not form a solid solution with the main component.

Moreover, in the above embodiments, the multilayer piezoelectric device is described; however, the invention can be applied to a piezoelectric device with any other structure such as a single layer structure.

The invention can be widely applied to fields such as actuators, piezoelectric buzzers, sound components, sensors and the like.

Obviously many modifications and variations of the present invention are possible in the light of the above teachings. It is therefore to be understood that within the scope of the appended claims the invention may be practiced otherwise than as specifically described.

What is claimed is:

1. A piezoelectric ceramic, comprising:
   a composition represented by Chemical Formula 1.

$$Pb_a[(Zn_{b/3}Nb_{2/3})_xTi_yZr_z]O_3 \quad \text{(Chemical Formula 1)}$$

wherein the values of a, b, x, y and z are within a range satisfying $0.94 \leq a \leq 1.02$, $1 < b \leq 3$, $x+y+z=1$, $0.05 \leq x < 0.125$, $0.275 < y \leq 0.5$ and $0.375 < z \leq 0.6$, respectively.

2. A piezoelectric ceramic according to claim 1 further comprising:
   1.0 mass % or less of at least one kind selected from the group consisting of antimony (Sb), tantalum (Ta), niobium (Nb), tungsten (W), molybdenum (Mo), iron (Fe), cobalt (Co), nickel (Ni) and chromium (Cr) in the form of oxide ($Sb_2O_3$, $Ta_2O_5$, $Nb_2O_5$, $WO_3$, $MoO_3$, $Fe_2O_3$, $Co_3O_4$, NiO, $Cr_2O_3$) in proportion to the composition.

3. A piezoelectric device, wherein
   a piezoelectric ceramic according to claim 1 is used.

4. A piezoelectric device according to claim 3, comprising:
   a plurality of piezoelectric layers made of the piezoelectric ceramic; and
   a plurality of internal electrodes inserted between the piezoelectric layers.

5. A piezoelectric ceramic, comprising:
   a composition represented by Chemical Formula 2.

$$(Pb_{e\text{-}f}Me_f)[(Zn_{g/3}Nb_{2/3})_uTi_vZr_w]O_3 \quad \text{(Chemical Formula 2)}$$

wherein the values of e, f, g, u, v and w are within a range satisfying $0.96 \leq e \leq 1.03$, $0.01 \leq f \leq 0.1$, $1 < g \leq 3$, $u+v+w=1$, $0.05 \leq u < 0.125$, $0.275 < v \leq 0.5$ and $0.375 < w \leq 0.6$, respectively, and Me indicates at least one kind selected from the group consisting of strontium (Sr), barium (Ba) and calcium (Ca).

6. A piezoelectric ceramic according to claim 5, further comprising:
   1.0 mass % or less of at least one kind selected from the group consisting of tantalum (Ta), antimony (Sb), niobium (Nb), tungsten (W), molybdenum (Mo), iron (Fe), cobalt (Co), nickel (Ni) and chromium (Cr) in the form of oxide ($Ta_2O_5$, $Sb_2O_3$, $Nb_2O_5$, $WO_3$, $MoO_3$, $Fe_2O_3$, $Co_3O_4$, NiO, $Cr_2O_3$) in proportion to the composition.

7. A piezoelectric device, wherein
   a piezoelectric ceramic according to claim 5 is used.

8. A piezoelectric device according to claim 7, comprising:
   a plurality of piezoelectric layers made of the piezoelectric ceramic; and
   a plurality of internal electrodes inserted between the piezoelectric layers.

* * * * *